(12) United States Patent
Hoei et al.

(10) Patent No.: US 8,023,334 B2
(45) Date of Patent: Sep. 20, 2011

(54) PROGRAM WINDOW ADJUST FOR MEMORY CELL SIGNAL LINE DELAY

(75) Inventors: Jung-Sheng Hoei, Newark, CA (US); Jonathan Pabustan, San Lorenzo, CA (US); Vishal Sarin, Cupertino, CA (US); William H. Radke, Los Gatos, CA (US); Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 460 days.

(21) Appl. No.: 12/262,405

(22) Filed: Oct. 31, 2008

(65) Prior Publication Data

US 2010/0110798 A1 May 6, 2010

(51) Int. Cl.
*G11C 16/04* (2006.01)
(52) U.S. Cl. .................... 365/185.24; 365/194
(58) Field of Classification Search ........... 365/185.24, 365/194
See application file for complete search history.

(56) References Cited

U.S. PATENT DOCUMENTS

| | | | | |
|---|---|---|---|---|
| 5,734,919 | A * | 3/1998 | Walsh et al. | 365/185.13 |
| 7,877,564 | B2 * | 1/2011 | Eldredge et al. | 365/185.18 |
| 2010/0220509 | A1 * | 9/2010 | Sokolov et al. | 365/45 |

OTHER PUBLICATIONS

Sarin, et al.; M+N Programming and M+L Bit Read for M Bit Memory Cells; U.S. Appl. No. 11/943,916, filed Nov. 21, 2007; Total pp. 46.
Roohparvar, et al.; Sensing Memory Cells in NAND Flash; U.S. Appl. No. 11/975,204, filed Oct. 18, 2007; Total pp. 42.

* cited by examiner

*Primary Examiner* — Tuan T. Nguyen
(74) *Attorney, Agent, or Firm* — Leffert Jay & Polglaze, P.A.

(57) ABSTRACT

A memory device and programming and/or reading process is described that compensates for memory cell signal line propagation delays, such as to increase the overall threshold voltage range and non-volatile memory cell states available. Memory cell signal line propagation delay compensation can be accomplished by characterizing the memory cell signal line propagation delay, such as determining an amount of error due to the delay, and pre-compensating the programmed threshold voltage of the memory cells based on the amount of error induced by the memory cell signal line propagation delay and cell location on the selected memory cell signal line. Alternatively, memory cell signal line propagation delay can be post-compensated for, or the pre-compensation fine tuned, after sensing the threshold voltages of the selected memory cells based on the amount of error induced by the memory cell signal line propagation delay and cell location on the selected memory cell signal line. Other methods, devices, etc., are also disclosed.

20 Claims, 16 Drawing Sheets

PROGRAM WINDOW ADJUST FOR MEMORY CELL SIGNAL LINE DELAY

TECHNICAL FIELD

The present disclosure relates generally to semiconductor memory, and in particular, the present disclosure relates to solid state non-volatile memory devices and systems that compensate for memory cell signal line signal delays.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

Buoyant HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes, such as floating gates or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A problem as non-volatile speeds increase and process feature sizes of integrated circuit sizes decrease is that signals face increasing issues with signal propagation delay due to increasing RC delay effects. One such issue due to RC delay effect is signal delay on access lines, such as word lines and on data lines, such as bit lines during reading and programming of non-volatile memory cells.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options having reduced access and data line delay effects.

DETAILED DESCRIPTION

Figure 1:
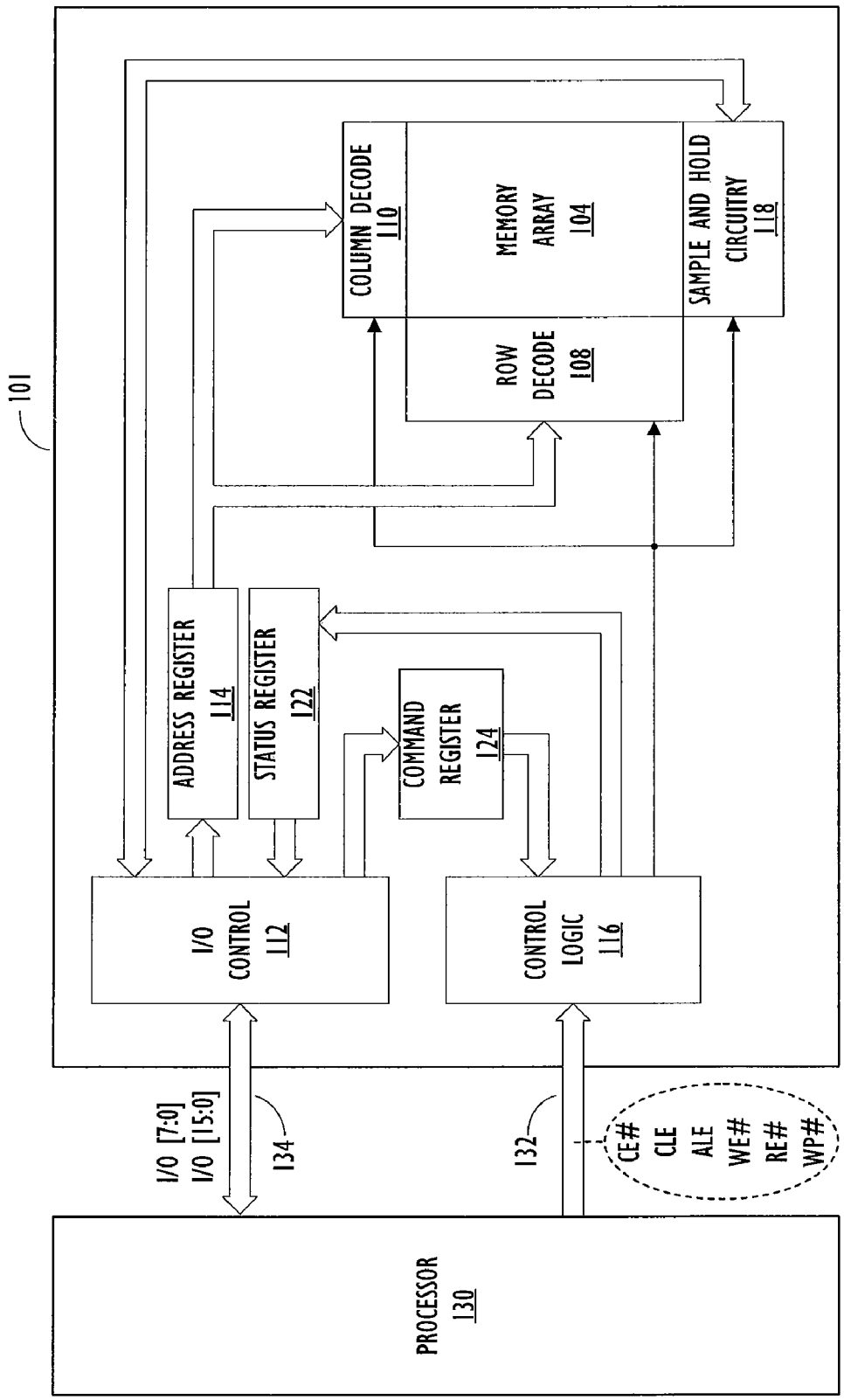
FIG. 1 is a simplified block diagram of a memory device according to an embodiment of the present disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage (Vt) ranges of 200 mV for each range, with each range corresponding to a distinct data state, thereby representing four data values, which may be in the form of four different bit patterns. Typically, a dead space, which can also be referred to as a margin, of 0.2V to 0.4V is between each range to keep the ranges from overlapping. If the Vt of the cell is within the first range, the cell may be deemed to store a logical 11 data state and is typically considered the erased state of the cell. If the Vt is within the second range, the cell may be deemed to store a logical 10 data state. If the Vt is within the third range, the cell may be deemed to store a logical 00 data state. And if the Vt is within the fourth range, the cell may be deemed to store a logical 01 data state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the Vt of the target memory cell is moved from the Vt range corresponding to the 11 data state to the Vt range corresponding to the 10 data state. Following programming of the LSBs, the most-significant bit (MSB) of each cell is programmed in a similar manner, shifting the Vt where necessary. When reading an MLC of a traditional memory device, one or more read operations determine generally into which of the ranges the Vt of the cell voltage falls. For example, a first read operation may determine whether the Vt of the target memory cell is indicative of the MSB being a 1 or a 0 while a second read operation may determine whether the Vt of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as Vt ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value (e.g., the bit pattern) of the cell. The memory devices of various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure and is shown coupled to an external host (e.g., processor) 130. Memory device 101 includes an array of memory cells 104 arranged in a logical matrix of rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog signals. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog signal using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital signal and to convert write data from a digital signal to an analog signal such that the memory device 101 could be adapted for communication with either an analog or digital data interface.

During a write operation, target memory cells of the memory array 104 are programmed until voltages indicative of their Vt levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
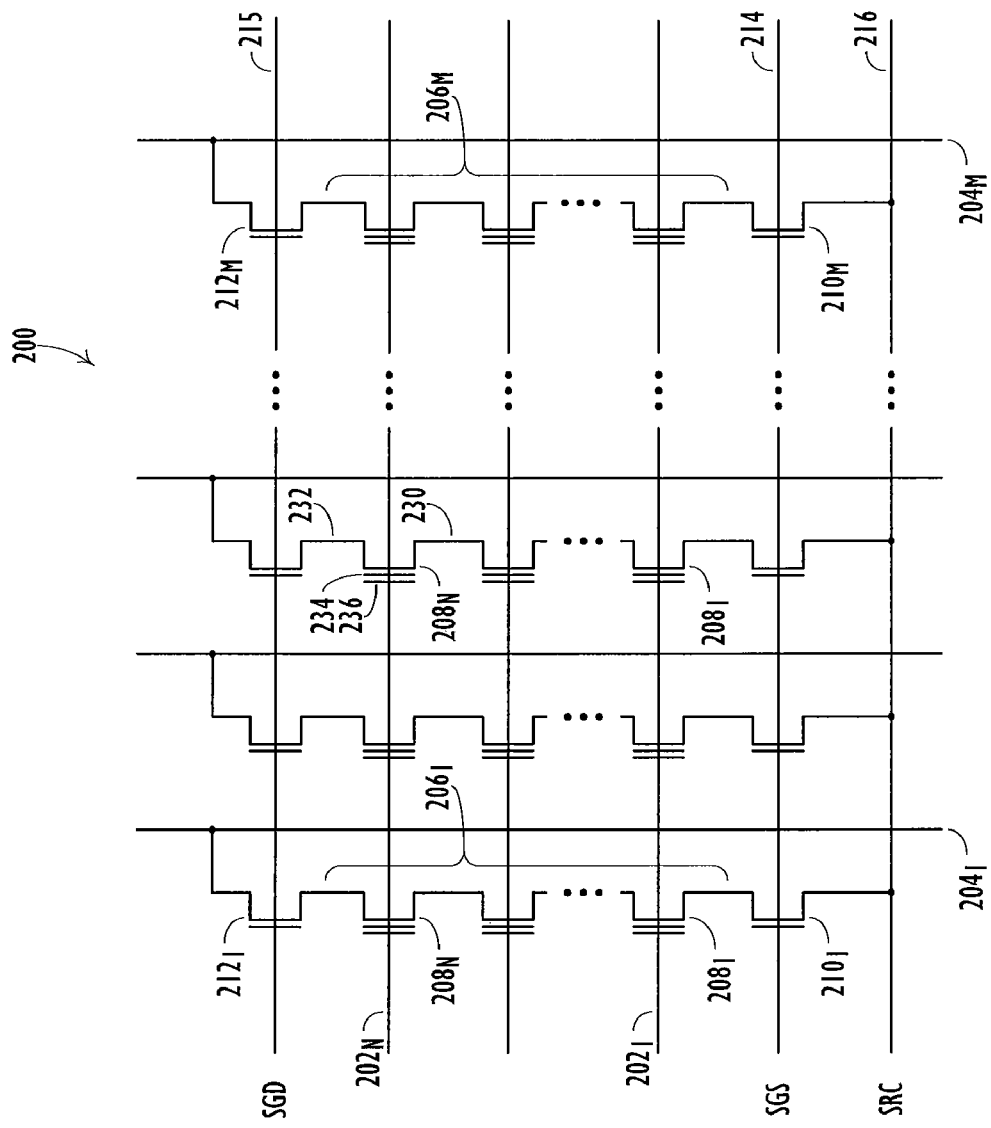
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes access lines, such as word lines $202_1$ to $202_N$ and intersecting data lines, such as bit lines $204_1$ to $204_M$. Reference made herein to memory cell signal lines are intended to refer to access lines, word lines, data lines, bit lines and other conductive lines used to provide control signals to or transfer data signals from memory cells of an array of memory cells, such as memory array 200, for example. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206. Although FIG. 2 illustrates a single NAND string 206 of memory cells coupled to each bit line 204, memory arrays such as memory array 200 can have many more NAND strings coupled to each bit line 204.

Typical construction of floating-gate transistors 208 includes a source 230 and a drain 232, a floating gate 234, and a control gate 236, as shown in FIG. 2. Floating-gate transistors 208 have their control gates 236 coupled to (e.g., forming) a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
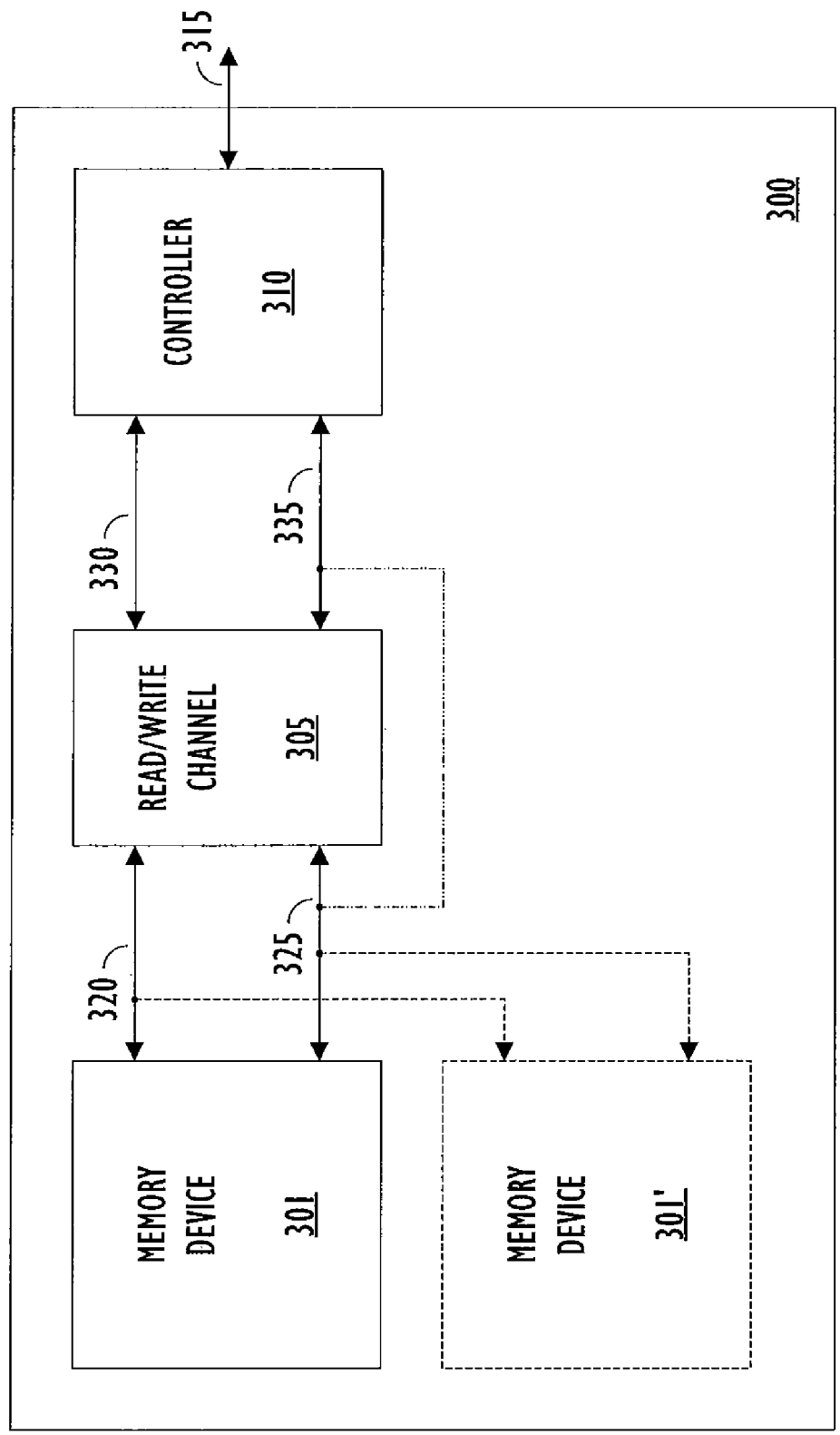
FIG. 3 is a block schematic of a solid state bulk storage device in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital signal to an analog signal and vice versa. For example, in a system adapted to store two bits per memory cell, a first voltage level or range of voltage levels of an analog data signal could correspond to a bit pattern of 11, a second voltage level or range of voltage levels of an analog data signal could correspond to a bit pattern of 10, a third voltage level or range of voltage levels of an analog data signal could correspond to a bit pattern of 00 and a fourth voltage level or range of voltage levels of an analog data signal could correspond to a bit pattern of 01. Thus, one analog data signal in accordance with the various embodiments could be converted to two or more digital data signals, and vice versa.

In practice, control and command signals are received at the bus interface 315 for access of the memory device 301 through the controller 310. Address and data signals may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing signals prior to accessing the memory device 301. In addition, the controller 310 may provide for load leveling within the one or more memory devices 301, such that physical addresses of the memory devices 301 may change over time for a given logical address. Thus, the controller 310 could map the logical address from the external device to a physical address of a target memory device 301.

For write requests, in addition to the command and address signals, the controller 310 could pass digital data signals to the read/write channel 305. For example, for a 16-bit data word, the controller 310 could pass 16 individual signals having a first or second binary logic level. The read/write channel 305 could then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller could pass command and address signals to the read/write channel 305. The read/write channel 305 could pass the read command and address signals to the memory device 301. In response, after performing the read operation, the memory device 301 could return the analog data signals indicative of the threshold voltages of the memory cells defined by the address signals and the read command. The memory device 301 may transfer its analog data signals in parallel or serial fashion.

The data may also be transferred as analog signals. In this situation, the read/write channel 305 may employ signal processing similar to that used in HDD accessing called PRML, which stands for partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal. This same type of processing can be utilized with embodiments of the present disclosure. By sampling the analog signal from the memory device 301, PRML processing can be employed to determine the likely pattern of threshold voltages responsible for generation of the analog signal.

Figure 4:
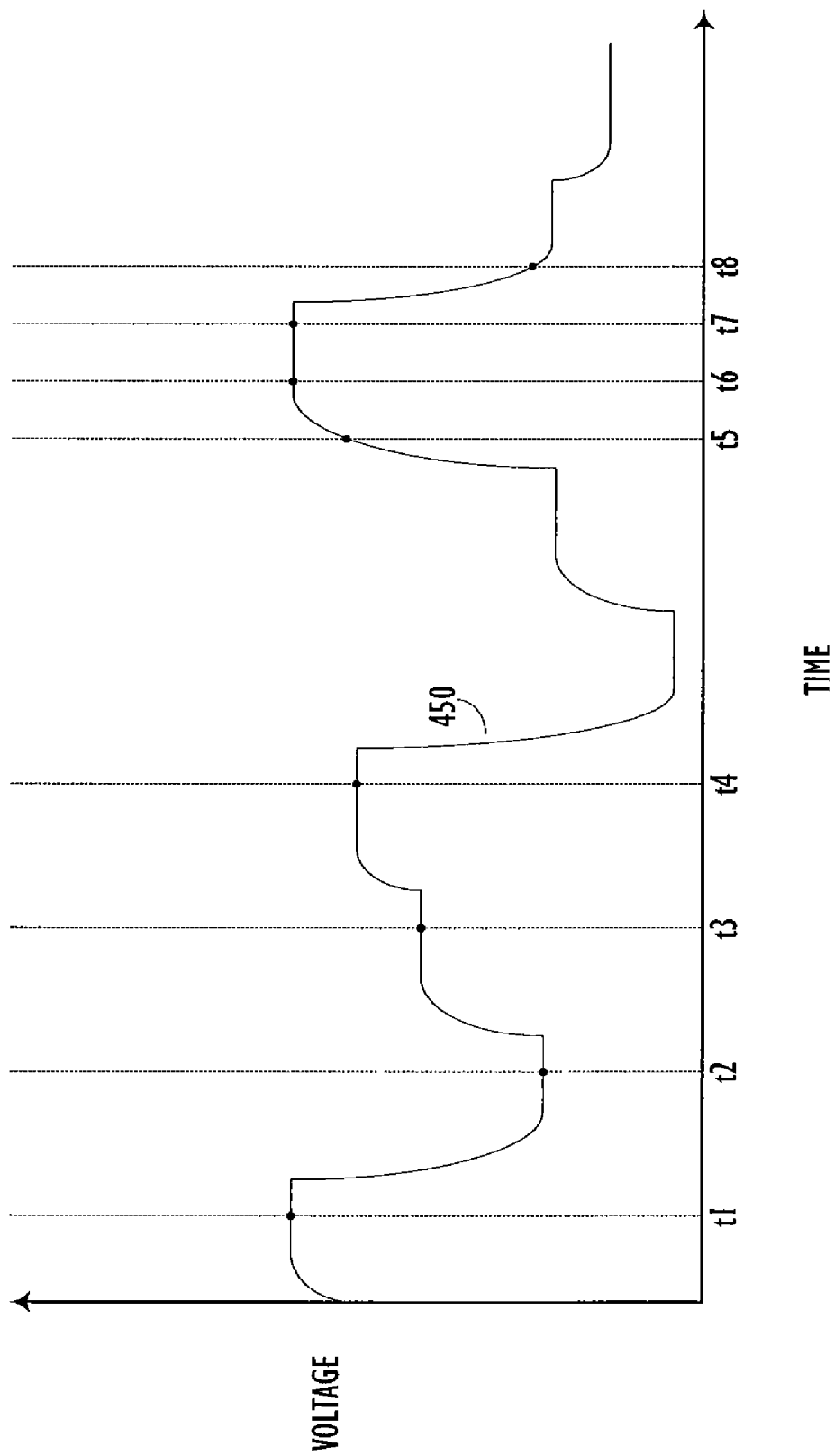
FIG. 4 is a depiction of a wave form showing conceptually a data signal as might be received from the memory device by a read/write channel in accordance with an embodiment of the present disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
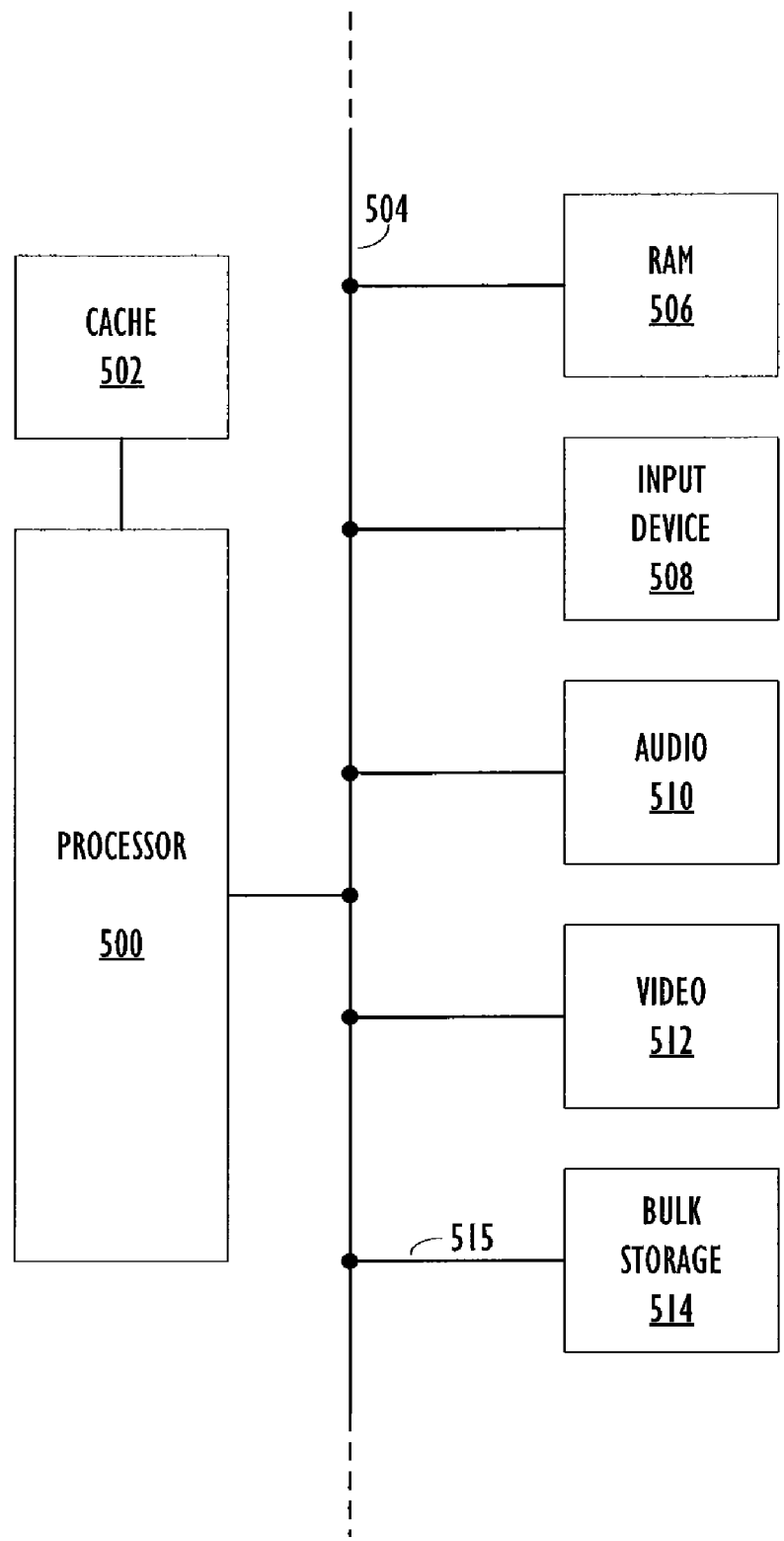
FIG. 5 is a block schematic of an electronic system in accordance with an embodiment of the present disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

Program Window Adjust for Memory Cell Signal Line Delay

The overall threshold voltage range of non-volatile memory cells in memories is generally constrained due to the limitations of a given cell design and process technology. In storing states, such as those representing a stored data value, this overall threshold range of a set of non-volatile memory cells, including those having multi-level cells and systems such as those described above, is typically divided into data state ranges (which are also known as "logic windows", windows, Vt distributions, or threshold states) to indicate the stored state. Typically, a buffer (also known herein as margin, dead space, buffer area of dead space, buffer margin, or buffer zones) is placed between each data state range to keep the ranges from overlapping. These data state ranges are generally referred to in operation of the memory by the data state it represents and/or the nominal threshold voltage level assigned to the range. As the overall threshold voltage range in a given non-volatile memory cell array is limited, much effort is expended to minimize effects that can further limit the size of this overall threshold voltage range in order to maximize the number of states that can be stored.

Many factors limit the number of states that modern non-volatile memories can reliably store and retrieve. These factors can include, but are not limited to, the overall threshold voltage range that is achievable, the likelihood of threshold voltage programming inaccuracy, programming/read disturb for the memory cell, and the required size of the buffer between data state ranges (that can vary in size due to memory cell programming inaccuracy, Vt disturb and cell characteristics, for example). Because of this, only a limited number of threshold voltage ranges (referred to herein as "data state ranges") can be used with a given cell and still be reliably programmed and read, regardless of the memory's ability to program and read at higher threshold voltage resolutions. The limited number of data state ranges for a given memory device, cell, and process technology are typically further restricted by the practice of using the data states to represent binary values, thereby further limiting the number of data state ranges to a power of two (e.g., 2, 4, 8, 16, 32, or 64 data state ranges to represent 1, 2, 4, 5, or 6 bits, respectively, in each cell).

Figures 6A, 6B:
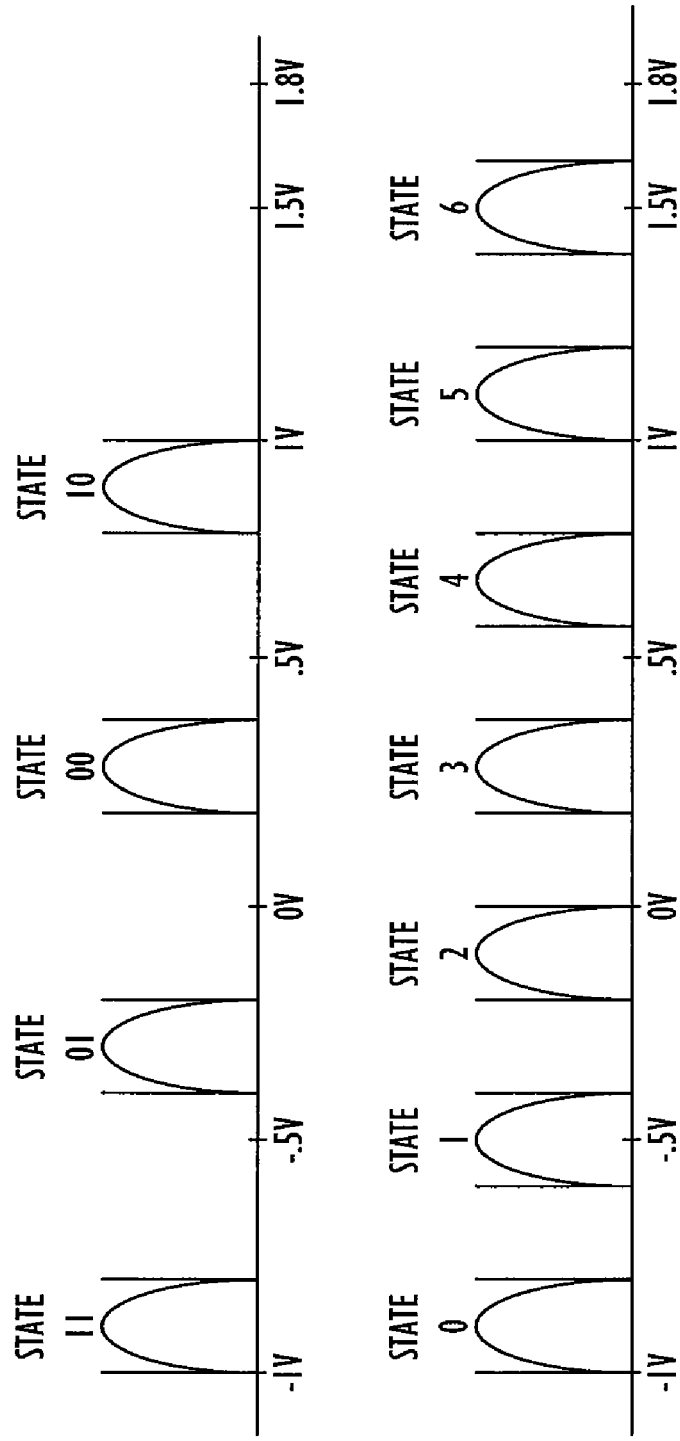
FIGS. 6A-6B are detail diagrams detailing states of non-volatile memory cells in accordance with embodiments of the present disclosure.

For example, in FIG. 6A an exemplary two bit-per-cell (i.e., M=4 states in the cell) MLC memory and threshold voltage range is detailed, having an overall threshold voltage range of −1.0V to 1.8V. Four data state ranges of 200 mV are used in each cell to represent the 11, 01, 00 and 10 states with a 200 mV to 400 mV buffer between the ranges. State 11 (erased) is defined to be from −1V to −0.8V, State 01 from −0.4V to −0.2V, State 00 from 0.2V to 0.4V, and State 10 from: 0.8V to 1.0V. In this exemplary memory the 10 data state is assigned to the 0.8V to 1.0V range and has a nominal threshold voltage level of 0.9V. The nominal threshold voltage for a given data state is typically utilized as the target voltage level to be gained in programming the memory cell to that data state (yet is typically not achieved exactly due to cell variations and programming over/undershoot). In reading or otherwise sensing a non-volatile memory cell (e.g., as part of a read or verify operation), the sensed threshold voltage of the memory cell is matched to one of the threshold voltage ranges (and the corresponding nominal threshold voltage/data state) to allow the state of the memory cell to be interpreted as digital data and then manipulated or transferred from the memory device. However, as the memory cells of the array of FIG. 6A have an overall threshold voltage range of −1.0V to 1.8V with a minimum usable range of 200 mV and a minimum buffer of 200 mV, a resolution of up to seven states is possible, as detailed in FIG. 6B (States 0 to 6—State 0: −1V to −0.8V, State 1: −0.6V to −0.4V, State 2: −0.2V to 0V, State 3: 0.2V to 0.4V, State 4: 0.6V to 0.8V, State 5: 1.0V to 1.2V, and State 6: 1.4V to 1.6V).

Due to the increased storage density of modern memory devices and reduced process sizes, the word line length, bit line length and the number of memory cells coupled to each word line and bit line (e.g., memory cell signal lines) of the array are generally increasing. At the same time, word and/or bit line cross sectional size and spacing is typically being decreased, increasing both the resistance and the capacitance of the memory cell signal lines. This increase in word line length, bit line length, load, resistance and capacitance, increases the RC time constants of the memory cell signal lines, effecting signal propagation delay. As such, a word line voltage driven onto a selected word line by the associated word line driver/row decoder experiences an increased delay in its propagation down the word line, for example. Memory cells coupled to a word line furthest from the driver will experience a different, generally time delayed, version of the signal seen by the memory cells coupled nearest the driver. Adding to this complication is the fact that memory operational speed has generally been increased, reducing the amount of time available for memory cell signal line signal propagation through increased clock frequencies and reduced time periods to perform basic memory operations that incorporate memory cell signal line signals, such as memory cell threshold voltage sensing and programming. For example, if a overall threshold range of 0V to 3V is determined to be most appropriate for a particular technology and memory cell in a given array, and the sensed threshold voltage (Vt) for cells can have 300 mV difference between cells nearest and farthest to a word line driver because of word line propagation delay error, the overall threshold range of the memory cells have been effectively reduced by 10% and leaves a 2.7V (0.3V-3V) overall threshold voltage range in which to define all data states.

One or more embodiments of the present disclosure compensate for memory cell signal line propagation delays, such as propagation delays (e.g., word line and/or bit line RC time constants) of the memory cell signal lines to compensate for sensing errors and to increase the overall threshold voltage range and data states available. Memory cell signal line propagation delay compensation in one or more embodiments of the present disclosure is done by pre-compensating the programmed threshold voltage of the memory cells based on the measured amount of error induced by the memory cell signal line propagation delay and cell location on a selected word line and along a selected bit line, for example. Alternatively, memory cell signal line propagation delay can be post-compensated for, or the pre-compensation fine tuned, in one or more embodiments of the present disclosure after sensing the threshold voltages of the selected memory cells based on the measured amount of error induced by the memory cell signal line propagation delay and cell location in an array of memory cells.

It is noted that, while the embodiments are described herein in relation to NAND architecture non-volatile memory arrays and devices utilizing digital and analog communication, it will be apparent to those skilled in the art that the concepts disclosed herein are applicable to other non-volatile memory array architectures and corresponding memory devices, including, but not limited to NOR arrays, AND arrays, OR arrays, and virtual ground arrays.

Non-volatile memory cells are typically erased, i.e., brought to some initial threshold voltage, prior to programming to their desired threshold voltage. This initial threshold voltage is usually a ground state or a negative voltage, e.g., 0V or −1V. Memory cells are then programmed in sequence to their desired threshold voltages (e.g., a target threshold voltage). Programming generally involves applying a series of programming pulses of increasing voltage to increase the charge stored on the floating gate, with each pulse typically followed by a verify operation to determine whether the memory cell has reached its desired threshold voltage. As individual memory cells reach their desired threshold voltage, they are inhibited from further programming. Upon reaching the desired threshold voltages for all memory cells of a selected page of a word line, programming is halted and the memory cells in the next page of the word line, or along a page of the next adjacent word line are then programmed. This process is repeated until memory cells along each selected page in the programming operation are programmed.

In programming and sensing (e.g., reading) a non-volatile memory cell, one or more embodiments of the present disclosure divide the overall threshold voltage range of the non-volatile memory cells into a number of ranges that is greater than the number of data states that can be stored by the cells, yielding a programming and/or a sense resolution (also known as programming and/or sensing granularity) for the memory device that can be higher than required by the data states of the cell. It is noted that in some embodiments of the present disclosure this programming and/or sense resolution, which refers to the number of ranges used in programming and/or sensing may be higher than the number of threshold voltage ranges the memory cells can reliably store (which typically corresponds to the number of data states). It is also noted that programming operation resolution can differ from that of sense operation resolution. In one embodiment the programming operation voltage resolution is lower than the read operation sense voltage resolution, allowing for increased read accuracy and data read back/encoding. In another embodiment of the present disclosure the programming operation voltage resolution is higher than the read operation sense voltage resolution, allowing for increased programming accuracy and state compensation, thereby increasing data storage stability and subsequent read back accuracy. As such, in one or more embodiments of the present disclosure, the memory device programs memory cells to one of M+N programmed states (where the N states are additional "soft" program states included to allow for the compensation of the final threshold voltage being selected and targeted in the cell) and/or senses one of M+L sense states from cells of the memory device (where the extra L "soft" sense states allow for increased read accuracy and data read back/encoding).

One such method of higher M+N bit programming resolution and higher M+L sensing resolution of memory cells in non-volatile memory devices and arrays is detailed in U.S. patent application Ser. No. 11/943,916, titled "M+N BIT PROGRAMMING AND M+L BIT READ FOR M BIT MEMORY CELLS," filed Nov. 21, 2007, which is commonly assigned.

During programming, the higher threshold voltage resolution contained in the "soft" programming data allows the programmed threshold voltage to be more accurately placed in the target data state range and allow for fine adjustments to the target programmed threshold voltage, enabling the subsequent sensing operation to be more reliable. Such fine adjustments can include, but are not limited to, compensation for program disturb effects, memory cell signal line propagation delay effects (as currently detailed herein) or other effects. For example, in the above detailed cell of FIG. 6B, the non-volatile memory cell has a usable threshold voltage range of −1V to 1.8V and stores 7 data states, with data state ranges of 200 mV each, and with 200 mV margins between the data state ranges (State 0: −1V to −0.8V, State 1: −0.6V to −0.4V, State 2: −0.2V to 0V, State 3: 0.2V to 0.4V, State 4: 0.6V to 0.8V, State 5: 1.0V to 1.2V, and State 6: 1.4V to 1.6V). Program disturb events in the array are predicted to move the programmed threshold voltage (Vt) of a selected cell 50 mV, for example. As such, the programming resolution is selected to program the threshold voltage in 50 mV or smaller steps and "soft" programming data is selected to allow for compensation of program disturb. E.g., allowing for programming the threshold voltage at 0.65V when a 50 mV program disturb is predicted in programming subsequent memory cells in order to place the final programmed threshold voltage of the cell in the center of the 0.6V to 0.8V range for State 4 (having a nominal threshold voltage of 0.7V).

In one exemplary embodiment of the present disclosure, the number of data states are a binary number (where M is the number of user data states being stored in the memory cell). It is noted that a number of program ranges/states can also be selected to be M+N, where N is an extra number of "soft" program resolution states utilized for adjusting programming data and compensating for predicted program disturb effects. It is noted, however, that the number of extra program states and the number of data states do not have to be a factor of two or represent a whole number of bits.

As noted above, in sensing memory cells, such as during read or verify operations, the threshold voltages of cells may be determined in a variety of manners. For example, a selected voltage signal, such as a voltage ramp, can be placed on a word line and the word line voltage sampled at the point when the target memory cell becomes activated. A voltage representative of the sampled word line voltage can then be held in a storage element or the sampled word line voltage converted by an analog to digital converter (ADC) to a digital representation that can be latched. In an alternative sensing method, word line voltages designed to activate the memory cell at each possible data state can be sequentially applied to the word line and the word line voltage sampled or the corresponding state latched when at the point when each memory cell becomes activated. In an alternative sensing method, a boosted voltage is applied to a first source/drain side of a target memory cell, and the threshold voltage taken as a difference between its control gate voltage and the voltage at its other source/drain side. As detailed above, voltage representative of the sampled word line voltage can then be held in a storage element, or the sampled word line voltage converted by an analog to digital converter (ADC) to a digital representation that can be latched.

In addition, a source-follower method of sensing non-volatile memory cells in NAND architecture non-volatile memory devices and arrays is detailed in U.S. patent application Ser. No. 11/975,204, titled "SENSING OF MEMORY CELLS IN NAND FLASH," filed Oct. 18, 2007, which is commonly assigned. In source follower sensing, a pass voltage (Vpass) is applied to the unselected word lines of a NAND memory cell string to operate the unselected transistors as pass transistors while a boosted voltage (Vsource, such as Vcc+) is applied to the source line of the NAND string. A voltage (Vout) is then expressed on a coupled bit line by the target memory cell. The bit line voltage (Vout) set by the target memory cell should then be the control gate voltage (Vg) of the target memory cell minus the programmed threshold voltage (Vt) of the target memory cell (Vout=Vg−Vt). The threshold voltage of the target memory cell can then be determined as the difference between the control gate voltage (Vg) and the voltage (Vout) expressed on the coupled bit line, Vt=Vg−Vout.

As stated above, in sensing operations of one or more embodiments of the present disclosure the threshold voltages of the selected memory cells are sensed at higher resolutions than required by the data states, yielding a sensed threshold voltage resolution (in sensed ranges) for the memory device that is higher than the number of data states of the cell. This allows for increased sensing accuracy and proximity based error correction in situations where the threshold voltage has drifted out of the data state range, enabling the memory device to compensate for Vt drift and disturb in "near" or "guess" reads (e.g., allowing for a guess as to the correct data state of the cell that can be confirmed with a quick ECC code check, whereas before only a read error would be reported and a computationally intensive ECC error correction algorithm started to attempt to correct the error(s)). In addition, in at least one embodiment the higher sensing resolution enables the utilization of data encoding techniques in the programming of data that enhance data read back (increasing reliability and error compensation) when utilized in conjunction with the higher data read resolution of one or more embodiments of the present disclosure. These data encoding techniques can include, but are not limited to, convolutional codes where additional granularity of information is used to make soft decisions and utilize probabilistic decoding techniques to achieve optimal decoding thereby reducing the overall error rate of the memory, partial response maximum likelihood (PRML), low-density parity check (LDPC), Turbo, and Trellis modulation encoding.

During sensing operations, the overall threshold voltage range of the non-volatile memory cells being sensed is divided into a larger number of threshold voltage ranges than required by the number of data states of the memory cell. This higher sensing resolution allows the sensed threshold voltage to be accurately read and placed in a data state threshold voltage range, enabling more reliable read and/or verify operation. Utilizing the above example from programming, the non-volatile memory cell has an overall threshold voltage range of −1V to 1.8V and stores 5 data states, each represented by a 400 mV range, with 200 mV buffers between the ranges (State 0: −1V to −0.6V, State 1: −0.4V to 0V, State 2: 0.2V to 0.6V, State 3: 0.8V to 1.2V, State 4: 1.4V to 1.8V). Disturb events are predicted to move the programmed threshold voltage (Vt) of a cell +/−50 mV. As such, the programming resolution is selected to sense the threshold voltage utilizing a 25 mV or lower resolution to allow for accurate threshold voltage read and possible error compensation/correction due to any threshold voltage drift.

In one embodiment of the present disclosure, the number of data states (M) are a factor of two, while the number of sense states (e.g., read states) (L) in the memory cell are also a factor of two where L is the number of extra states being utilized in sensing level data or read data). It is noted, however, that the number of extra sense states and the number of data states also do not have to be a factor of two. In at least one embodiment of the present disclosure, read operations utilize a higher resolution than a corresponding programming operation, enabling an increased amount of data to be available for processing when read. Thus, in a binary implementation utilizing M+N ranges/states and M+L sense ranges/states, L will be greater than N.

Figure 7A:
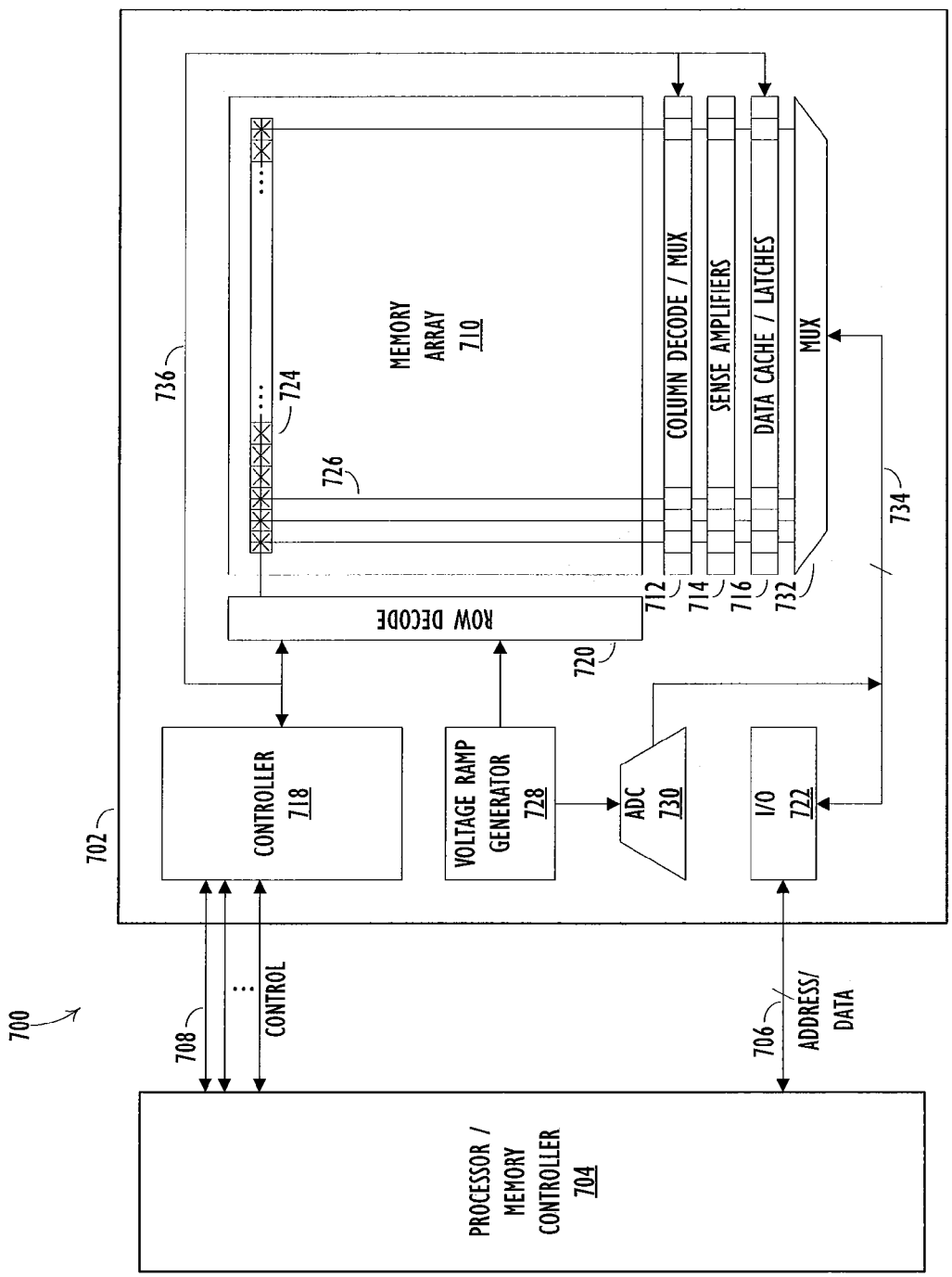
FIGS. 7A and 7B are block schematics of an electronic system and non-volatile memory device in accordance with an embodiment of the present disclosure.

In FIG. 7A, a simplified diagram of a system 700 is illustrated having a non-volatile memory device 702 of an embodiment of the present disclosure coupled to a host 704, such as a processor or memory controller. The non-volatile memory device 702 includes an array of memory cells 710 arranged in rows and columns. A row decode circuit 720 and a column decode circuit 712 are provided to decode address signals provided to the memory device 702 by the host 704. Address signals are received and decoded to access memory array 710. Memory device 702 also includes input/output (I/O) control circuitry 722 to manage input of commands 708, addresses and data 706 to the memory device 702 as well as output of data and status information from the memory device 702. Control logic 718 controls access to the memory array 710 in response to commands and generates status information for the external host (e.g., processor) 704. The control logic 718 is coupled 736 to row decode circuit 720 and column decode circuit 712 to control the row decode circuit 720 and column decode circuit 712 in response to the addresses. The control logic 718 is also coupled 736 to a data cache 716, which latches data, either incoming or outgoing. The individual latches of the data cache 716 are coupled to the read/write circuitry incorporating sense devices (e.g., sense amplifiers) 714 and the column decoder/multiplexer 712. The individual latches of the data cache 716 are also coupled to the I/O control circuit 722 through an internal data bus 734 and multiplexer 732. The sense amplifiers 714 also contain internal latches that are utilized to store data to programmed into a selected memory row 724 of the memory array 710, or to latch data sensed from a page of memory cells of a row 724 of the array 710 to then be compared against the program data stored in the data latch 716 in a verify operation or transferred to the data latch 716 to be read from the memory 702 in a read operation. The sense amplifiers can be multiplexed to two or more data lines, such as bit lines 726, of the memory array 710 through the column decoder 712, which selects a physical page of memory cells from the selected row 724. According to one or more embodiments of the present disclosure, the sample and hold circuitry 118 of FIG. 1 might comprise one or a combination of sense amplifiers 714, data cache 716 and multiplexor 732, for example.

The memory device 702 is configured to utilize a word line voltage ramp for threshold voltage sensing. Upon initiation of a sensing operation of one or more selected memory cells from the non-volatile memory device array 710 a ramp voltage is generated by a ramp voltage generator 728 which is coupled to the selected word line of a row 724 of the array 710 through the row decoder 720. An analog to digital converter (ADC) 730 is also coupled to the ramp voltage generator 728 that converts the signal generated by the ramp voltage generator 728 to a digital representation. The digital representation of the word line voltage ramp signal is expressed on the internal data bus 734 by the ADC 730 and coupled to the data cache 716 through the bus multiplexer 732. As the voltage placed on the selected word line 724 is ramped under control of the ramp voltage generator 728, the non-volatile memory cells of the selected row turn on and begin to flow current as their programmed threshold voltages (Vt) are reached. This current flow is sensed from the selected page of the row 724 by the coupled sense amplifiers 714, which trigger the data cache 716 to latch in the digitized representation of the word line voltage signal of the ramp voltage generator 728 that is currently being expressed by the ADC 730.

It is noted that in the memory device 702 of FIG. 7A, the threshold voltages being programmed into selected memory cells are encoded in a digital representation having an higher program resolution, while sensed threshold voltages are matched to a digital representation of the higher read resolution. It is also noted that this sensing and matching of the threshold voltage to a digital representation can be accomplished by any one of the above detailed methods, including, but not limited to, traditional multi-pass reading, ramped word line voltage reading, or source-follower reading. For example, a ramped word line voltage reading can be accomplished by utilizing a ramp generator combined with an ADC, such as illustrated in FIG. 7A. Additional methods may also be utilized such as utilizing a counter combined with a ramp generator or a counter based DAC, for example.

As stated above, modern memory devices are experiencing increased memory cell signal line (e.g., word line and/or bit line) signal propagation delay due to increased memory device storage density and reduced process sizes, which have the effect of increasing memory cell signal line lengths and load while increasing memory cell signal line resistance and capacitance through reduced cross sectional area, feature sizes and spacing. This increase in memory cell signal line length, load, resistance and capacitance, increases the RC time constants of the memory cell signal lines and signal propagation delay. As such, a word line voltage driven onto a selected word line by the associated word line driver/row decoder experiences increased delay in its propagation down the word line, for example. Thus, memory cells coupled to the word line furthest from the word line driver will experience an altered version of the signal seen by the memory cells coupled nearest the driver. This word line delay can cause the memory cell to be erroneously programmed with the wrong threshold voltage or sensed as having a differing threshold voltage than what is actually stored. A similar effect can occur for memory cells of NAND strings coupled to a common bit line as the distance between the NAND string comprising a selected memory cell and the column decode 712 and/or sense amplifier circuitry 714 increases, for example.

Figure 7B:
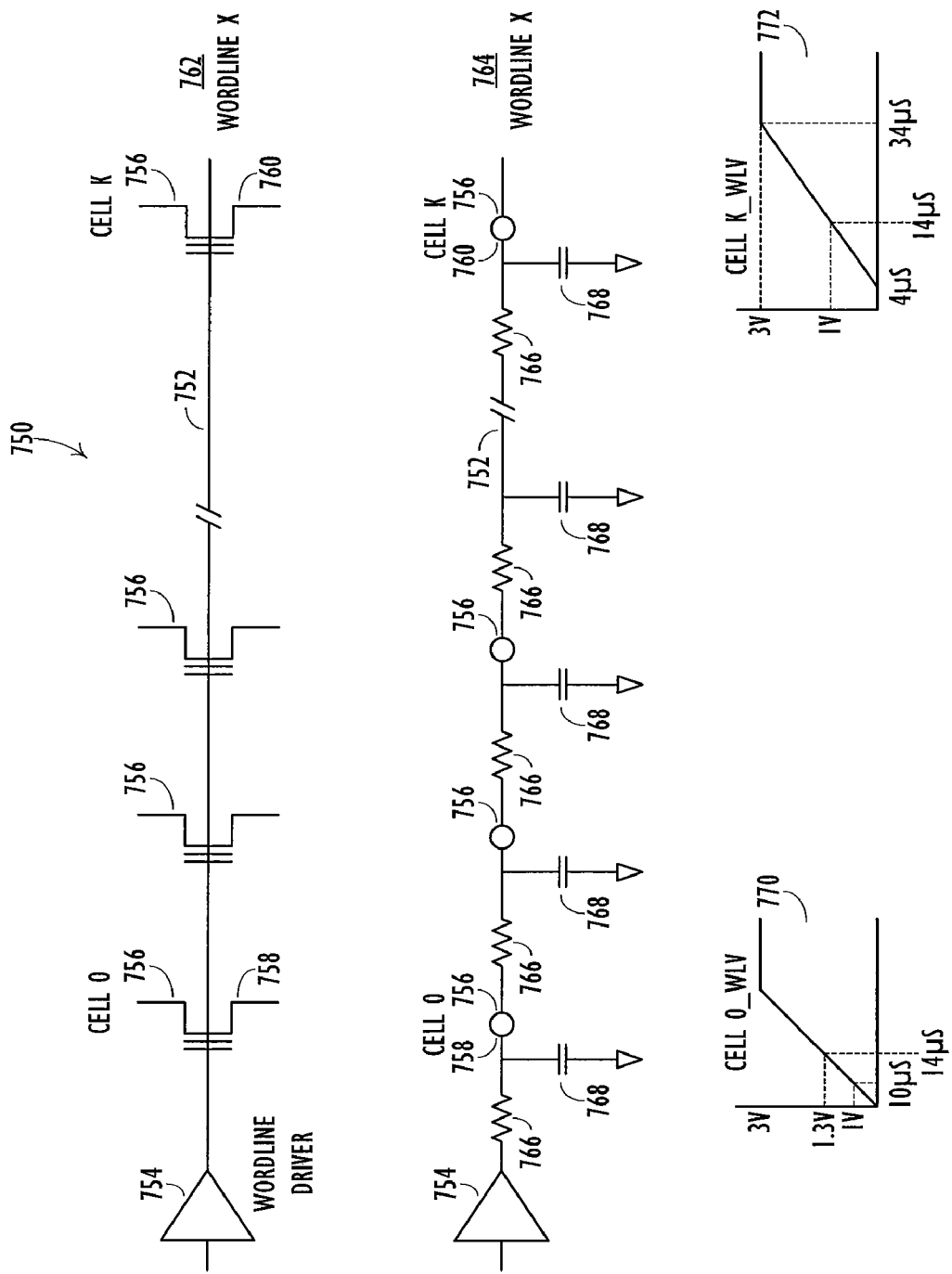

FIG. 7B details a simplified diagram 762 of a row 750 of a word line 752 and word line driver 754 and the RC load equivalent 764 of one or more embodiments of the present disclosure. In FIG. 7B, a row 750 is detailed showing a word line 752 coupled to word line driver 754 of a row decoder, the word line 752 having a plurality of non-volatile memory cells 756 coupled along its length. A first memory cell (Cell 0) 758 is coupled to the word line 752 in close proximity to the output of the word line driver 754. A second memory cell (Cell K) 760 is coupled to the end of the word line opposite the word line driver 754. An RC load equivalent 764 of the word line 752 and driver 754 is also detailed showing the resistive 766 and capacitive 768 load of each section of the word line 752 between memory cells 756. Due to this RC load of the word line, any signal applied to the word line 752 by the driver 754 experiences delays as it propagates down the word line 752. For example, as detailed in waveforms 770 and 772 of FIG. 7B, a word line voltage ramp signal of a ramp sensing operation is delayed by 4 µS at Cell K 760, and has only applied 1V to the control gate of Cell K 760 at 14 µS, while Cell 0 has 1.3V being applied at 14 µS. Thus, if both Cell 0 758 and Cell K 760 were programmed to Vt=1V, Cell 0 would turn on and be sensed at 1V while Cell K 760 would be erroneously sensed as having been programmed at 1.3V. Thus, a latch of 716 associated with Cell 0 758 and a latch of 716 associated with Cell K might contain a digital equivalence of 1V and 1.3V, respectively, for example. To account for this in the prior art the data state ranges are typically adjusted wider (i.e., such that 1.3V falls into the nominal 1V data state, loosing potential data storage range), or the sensing time increased to allow for a longer word line signal propagation time due to the RC load (slowing the memory speed). This results in an overall reduction in the total usable memory cell threshold voltage range in which to place possible logic states.

It is noted that many array architectures also utilize multiple drivers 754 coupled at differing points on each word line 752 to drive the selected word line voltage on to the word line. In these multiple driver 754 configurations the memory cells 756 situated on the word line 752 furthest from an active driver 754 will see the largest signal propagation delays due to RC time constant of the word line 752. It is also noted that, while the word line 750 and coupled non-volatile memory cells 756 are described herein in relation to NAND architecture non-volatile memory arrays, it will be apparent to those skilled in the art that the concepts disclosed herein are applicable to other non-volatile memory array architectures incorporating word lines, including, but not limited to NOR arrays, AND arrays, OR arrays, and virtual ground arrays.

As stated above, one or more embodiments of the present disclosure compensate for memory cell signal line propagation delays to compensate for sensing errors and to increase the overall threshold voltage range and non-volatile memory cell states available. For example, word line propagation delay compensation in one or more embodiments of the present disclosure is accomplished by pre-compensating the programmed threshold voltage of the memory cells utilizing higher M+N state per cell programming resolution based on the measured amount of error induced by the word line propagation delay and cell location on the selected word line. Alternatively, word line propagation delay in one or more embodiments of the present disclosure is post-compensated for or the pre-compensation fine tuned after sensing the threshold voltages of the selected memory cells with an higher resolution M+L state read, based on the measured amount of error induced by the word line propagation delay and cell location on the selected word line. In this, the M data states represent M "hard" states of data stored in the cell and the N-states or L-states represent the extra "soft" states of additional programming or read resolution, respectively, to be utilized by the non-volatile memory, memory controller or system for cell Vt level programming or data interpretation and error correction of the sensed Vt level of each memory cell.

In order to compensate the propagation delay of a memory cell signal line, the delay can be characterized. It is noted that the exponential increase and decrease of signals on a signal line with an RC time constant are generally understood. For example, the structure of the RC load equivalent 764 of the word line 752 of FIG. 7B is that of a sequence of series coupled low pass RC filters and corresponding response. As such, the actual propagation delay of a memory cell signal line can be characterized by extrapolating from two measurements of a known memory cell signal line signal (step function, ramp, etc.) at differing points on the loaded memory cell signal line to characterize the propagation delay of the memory cell signal line for the memory device and current environmental conditions. This can then be used to allow the actual memory cell signal line signal to be predicted at a given memory cell position on a particular word line or bit line for a given memory cell signal line signal. Such extrapolation is made easier where a word line signal is changing in a regular and constant rate, for example. In particular, with step or ramping word line signals, such as those utilized for sensing, the propagation delay effect on the word line signal is primarily seen as a linear effect due to the time shifting of the word line voltage. In other words, after a delayed start, Cell K 760 simply sees a lower word line voltage than that seen at the control gate of Cell 0 758 (near the driver output) at any given time during the word line voltage ramp signal. The memory cell signal line propagation delay characterization of a memory device array can be done either during the manufacturing process and stored in the memory for later use during programming or sensing memory cells. Alternatively, the propagation delay of the memory can be characterized in real time during the initialization of the memory after power-up or reset, or before initiating programming and/or sensing operations. An advantage of characterizing during initialization or before programming is that the memory cell signal line propagation delay characterization information is determined at the current memory device's temperature and supply voltage environment. Once characterized, a controller, such as controller 310, can initiate a command to read this information and use an algorithm to calculate an amount of compensation based on a cell's physical location in the array and the characterization information.

Figure 8:
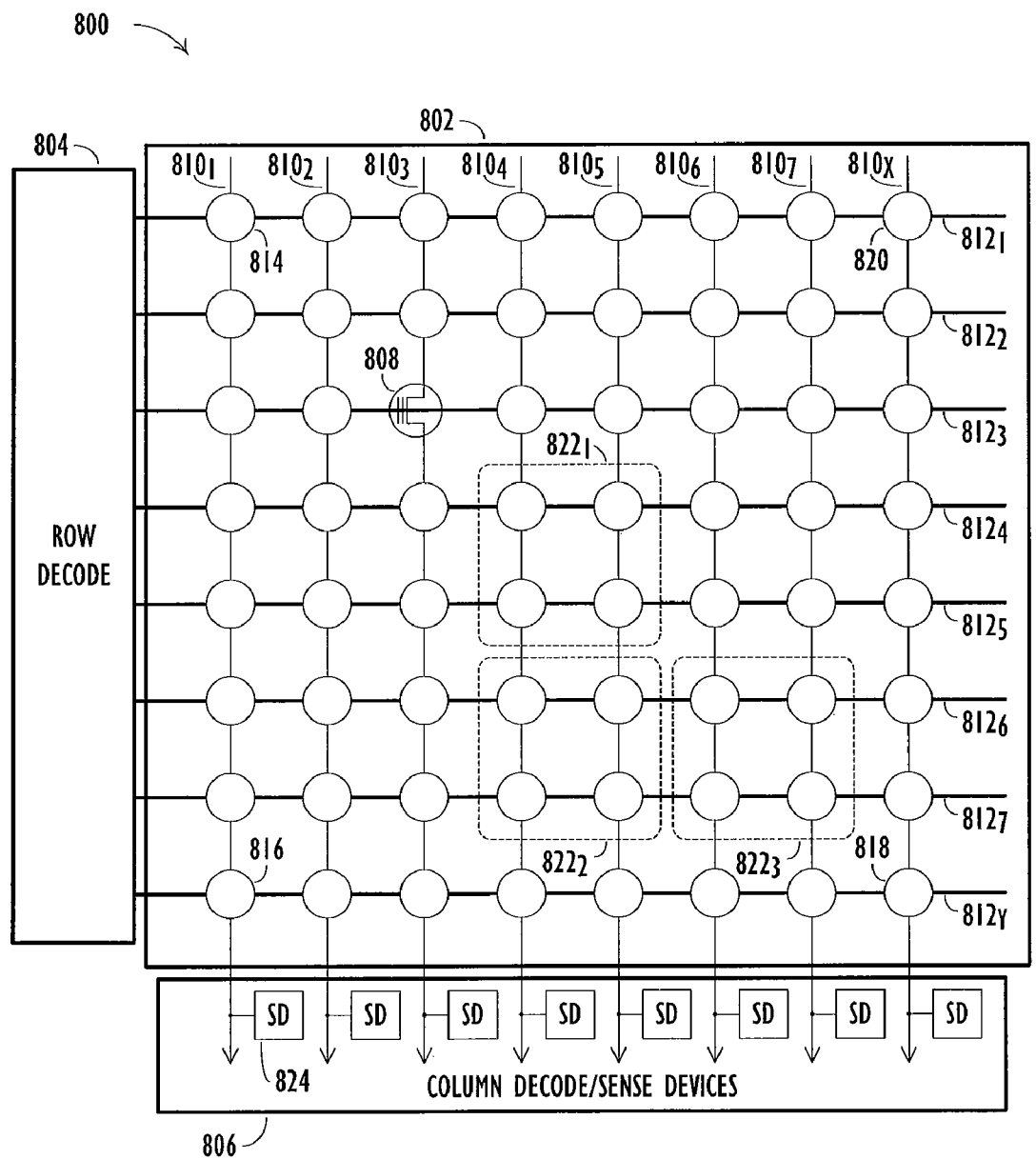
FIG. 8 is a graphical representation of an array of memory cells in accordance with an embodiment of the present disclosure.

FIG. 8 illustrates an array of memory cells 802, arranged in rows 812 and columns 810 according to one or more embodiments of the present disclosure. The array of memory cells 802 are shown coupled to row decode 804 circuitry such as 720 of FIG. 7 and column decode 806 circuitry such as 712/714/716 circuitry also shown in FIG. 7, for example. Each circle of FIG. 8, such as 814, is representative of a memory cell and is shown in a simplified form so as to increase readability of the Figure. A schematic representation of the memory cells of 802 is shown at 808. Each column 810 is also shown in block 806 as being coupled to a sense devices (SD) (e.g., sense amplifiers), such as 824, for example. The array of memory cells 802, row decode circuitry 804 and column decode circuitry 806 are shown in a simplified form and might consist of many more memory cells, rows, columns and additional circuitry as is known to those skilled in the art.

As discussed above, memory cell signal line delay determination and/or compensation might be performed on memory cell signal lines (e.g., word lines and/or bit lines) according to various embodiments of the present disclosure. By way of reference to FIG. 8, memory cell 816 is likely to experience the least amount of word line and bit line delay effects, with respect to other memory cells of the array 802, due to its proximity to the row decode circuitry 804 and the column decode circuitry 806. However, the further a particular memory cell is from the row 804 and/or column 806 decode circuitry, the increased chance that memory cell signal line delay effects will have an influence on the memory cell. For example, a memory cell such as 814 is likely to experience the greatest amount of bit line signal delay with minimal effect from word line signal delay because memory cell 814, like cell 816 is nearest to the row decode circuitry 804 but farthest from the column (e.g., bit line) decode circuitry 806. Similarly, memory cell 818 is likely to experience a minimal amount of bit line signal delay, due to its proximity to the column decode circuitry 806 and a maximum amount of word line signal delay because it is furthest from the row decode circuitry 804. Finally, memory cell 820 is likely to experience the greatest effect from both word line and bit line signal delay because of its relative location furthest from both the row decode 804 and column decode 806 circuitry. Thus, memory cells located throughout the array of memory cells, such as 808, will likely experience some amount of signal delay caused by a combination of word line and/or bit line signal delay effects based on its location.

FIG. 8 further illustrates that the memory cells of the array of memory cells might be grouped into smaller groups 822 (e.g., memory sectors) of the memory array 802 according to one or more embodiments of the present disclosure. This grouping of memory cells into sectors can be used to differentiate the correction (e.g., compensation) that might be needed by the cells of a particular sector. Instead of having to generate a correction factor for each and every cell of the array of memory cells 802, a smaller number of corrections might be generated and specifically applied to a particular sector 822. A particular correction factor can then be determined for each sector 822 wherein the same particular correction is applied to all the memory cells of a given sector. For example, a correction factor might have been determined for cells residing in sector $822_1$, for example. A second correction factor might have been determined for memory cells residing in sector $822_2$ and so on, for example. It can be seen by way of reference to FIG. 8 that a correction generated for sector $822_2$ might be weighted more towards correcting word line signal line delays then by column decode signal delays, for example. The bit line signal delay correction for sector $822_3$ might be weighted similarly to that of sector $822_2$ but may be weighted even more heavily towards word line signal delay effects than sector $822_2$. This is because sectors $822_2$ and $822_3$ are located the same distance from the column decode circuitry 806 however, sector $822_3$ is located further from the row decode circuitry 804 than sector $822_2$. The particular correction for each sector 822 might be determined by such methods of measuring the delays of each memory cell of a particular sector 822 and determining an average of the corrections needed for each cell. Other methods, such as various statistical methods known to those skilled in the art might also be used to arrive at a particular sector's correction value according to one or more embodiments of the present disclosure.

Figure 9A:
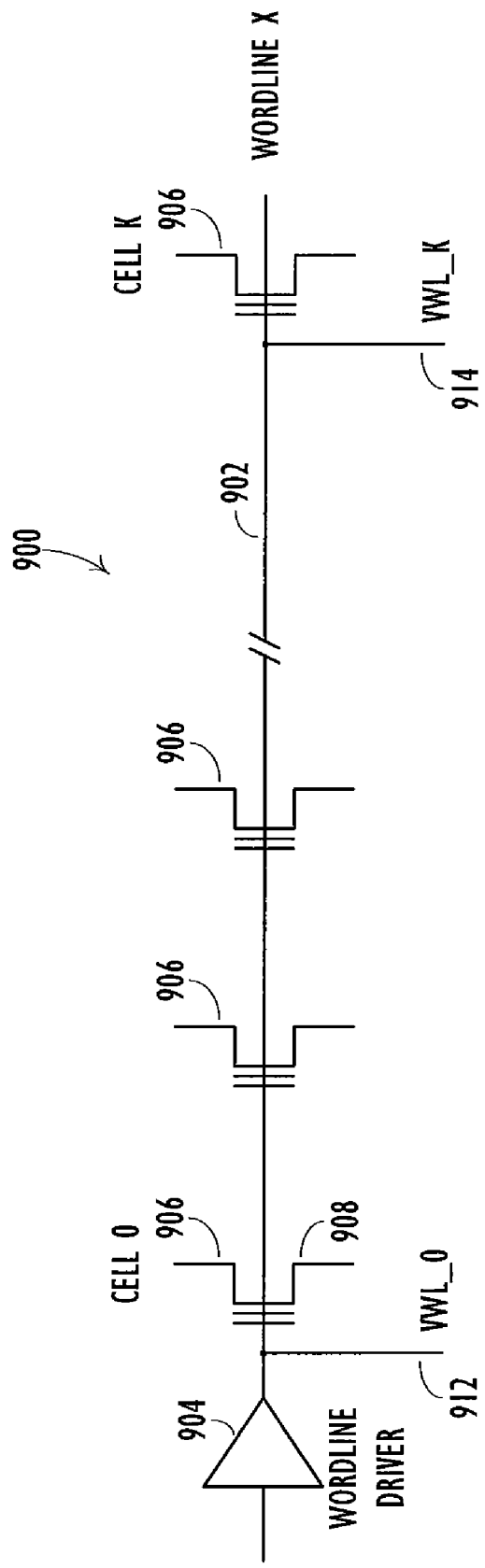
FIGS. 9A, 9B and 9C are schematics of word lines and delay compensation characterization of a non-volatile memory array in accordance with embodiments of the present disclosure.

As stated above, in characterizing the memory cell signal line propagation delay, voltage levels of the memory cell signal line need to be taken at two or more differing points along it's length. FIG. 9A illustrates a word line circuit 900 of one or more embodiments of the present disclosure that samples the word line voltage signal at two differing points 912, 914 along the word line 902 to characterize the word line delay. In FIG. 9A, a word line 902 is coupled to word line driver 904 of a row decoder. The word line 902 is coupled to a plurality of non-volatile memory cells 906. A selected word line voltage signal is applied to the word line 902 and voltage samples taken at least at a first point (Vwl_0) 912 and a second point (Vwl_K) 914 along the length of the word line 902 at one or more selected times during the word line signal propagation down the word line 902 to allow for characterization of the word line propagation delay from the shape of the input word line voltage signal. It is noted that, according to one or more embodiments in the case where the input word line voltage signal is used as one of the voltage samples (in other words the word line voltage is effectively sampled at Cell 0 908 at the output of the word line driver 904) only a single other voltage sample along the word line 902 might be used to characterize the word line propagation delay. Memory cell signal line characterization can be done, for example, during the manufacturing process and stored in the memory device initialization data for use during operation or calculated during each memory initialization (such as during power-up or after reset) before utilization so that the characterization data is real time and conforms better to the environment (such as, but not limited to, temperature, supply voltage, etc.) that the memory device finds itself operating in.

In one or more embodiments of the present disclosure the word line delay can also be characterized utilizing one or more non-volatile memory cells coupled to the word line. Memory cell sensing and programming errors that are due to memory cell signal line propagation delays, such as word line and/or bit line propagation delays, are highly dependent on the operating speed of the memory device. For example, errors due to word line propagation delay errors are believed to be mainly caused by the transition speed of the word line voltage signal and/or the sense amplifier sampling times of the bit lines coupled to the memory cells. As such, slowing the memory down (e.g., slowing memory operational speed) to stretch out the transition time of the word line voltage signal and/or the sense amplifier sampling times should allow the memory cells coupled to a selected word line to be programmed and sensed without having memory cell signal line propagation delay induced errors. This allows the memory cell signal line delay to be characterized by programming one or more non-volatile memory cells located at different locations in the memory array at slow speed to a known threshold voltage, such as 1V. For example, a word line programming voltage ramp rate much greater than the word line RC time constant (e.g., >1000 times) might be utilized. The selected word line, for example, is then sensed at full operational speed and the difference between the threshold voltages are compared to characterize the memory cell signal line propagation delay. In one alternative embodiment, the one or more non-volatile memory cells are programmed at full speed and the memory cells sensed at slow speed to characterize the word line propagation delay.

Figure 9B:
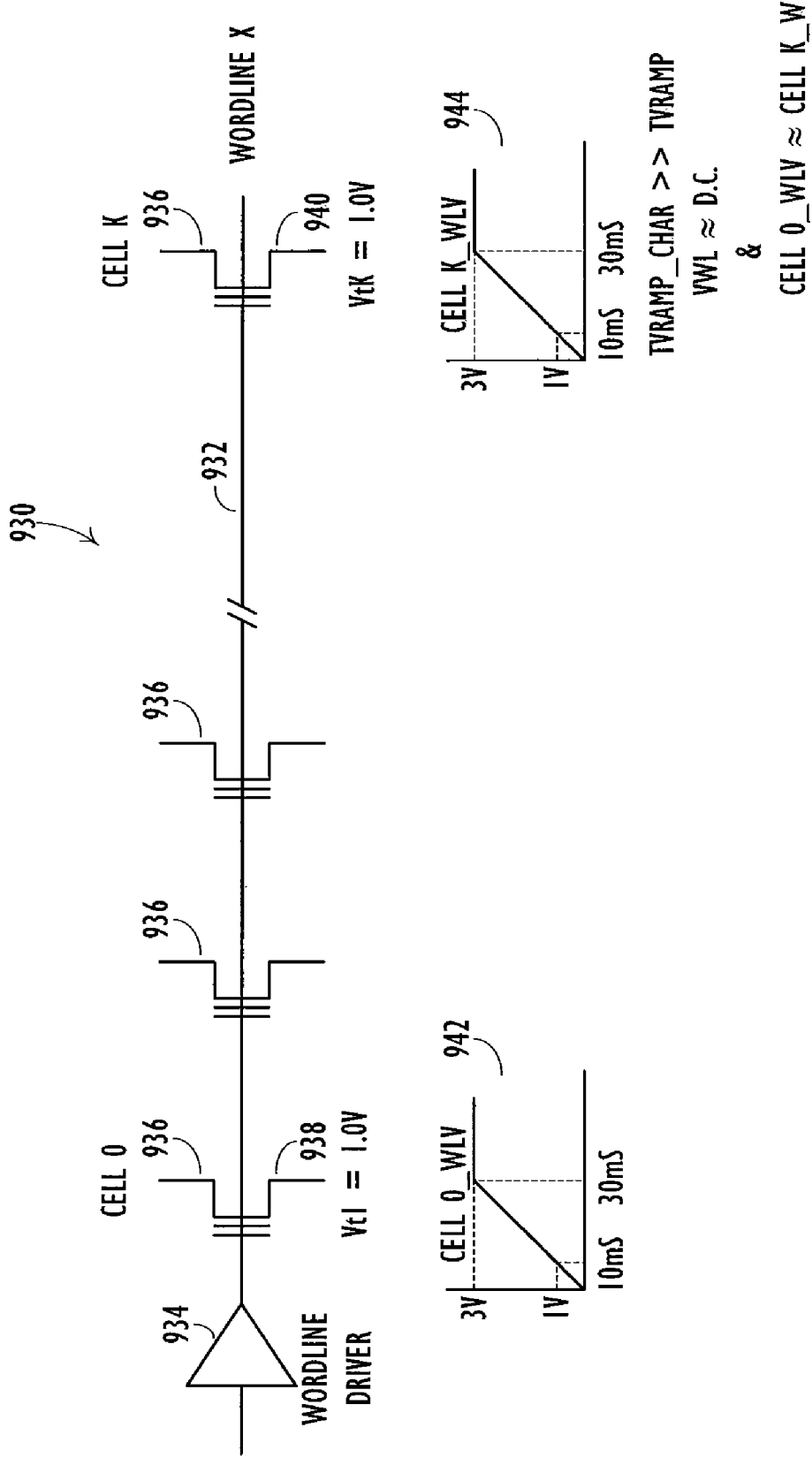

FIG. 9B illustrates a word line circuit 930 of one or more embodiments of the present disclosure that characterizes word line propagation delay utilizing two or more of the memory cells 936 coupled to the word line 932 and ramped word line voltage to sensing. In FIG. 9B, a word line 932 is coupled to word line driver 934 and a plurality of non-volatile memory cells 936. A first memory cell (Cell 0) 938 is coupled to the word line 932 in close proximity to the output of the word line driver 934 and a second memory cell (Cell K) 940 is coupled to the end of the word line 932 opposite the word line driver 934. A slowed ramping word line voltage signal 942, 944 is applied to the word line 932 during verification of the programming cycle to sense the threshold voltage of the memory cells to program the first and second memory cells to a known threshold voltage of 1V. As a 1000× slowed word line ramp voltage signal 942, 944 (i.e., it takes 10 mS to transition to 1V and 30 mS to get to 3V on the word line versus 10 μs and 30 μs, respectively, at full speed) is utilized for sensing during the programming cycle, word line propagation delay should not corrupt sensing of the non-volatile memory cells during verification and the first cell 938 (Cell 0) and second cell 940 (Cell K) are thus programmed to Vt=1V each. The first cell 938 (Cell 0) and second cell 940 (Cell K) are then sensed with a ramped word line voltage at full speed to determine the difference in sensed Vt level due to word line propagation delay and characterize the delay of the word line 932. As word line propagation delay is proportional to distance from the word line driver 934 and the error in the applied word line control gate voltage is directly proportional to the error in the sensed threshold voltage (Vt), the error in the sensed threshold voltage (Vt) of a memory cell 936 due to the word line propagation delay can then be calculated from the cell's relative position on the word line 932 and the delay characterization once the word line propagation delay has been characterized. This is particularly the case with stepped or ramped word line voltage sensing, where the word line voltage ramp is time shifted due to the propagation delay of the word line. It is noted that once programmed to the selected test threshold voltage the first and second non-volatile memory cells (Cell 0 938 and Cell K 940) can be left in place in the memory and utilized again to update the word line propagation delay characterization of the memory device, such as during memory initialization after power-up or a reset. It is also noted that although the first and second non-volatile memory cells of the word line propagation delay test cell pair (Cell 0 938 and Cell K 940) are positioned near the word line driver 934 and near the opposite end of the word line 932, respectively, they can be placed anywhere along the word line 932 so long as there is sufficient spacing between the two cells to generate sufficient differences in sensed threshold voltage to accurately characterize the word line propagation delay error. It is further noted that, in the case where the input word line voltage signal is used as one of the threshold voltage samples (in other words the word line voltage is effectively sampled at Cell 0 938 at the output of the word line driver 934) only a single other memory cell (Cell K) 940 is programmed to a known threshold voltage and utilized to characterize the word line propagation delay.

It is noted that the memory cells used for characterization can be programmed to a known threshold voltage at the end of manufacture and left in place in the array to be utilized for memory cell signal line propagation delay characterization. In one or more alternative embodiments of the present disclosure, the memory cells used for characterization are re-established and programmed to known threshold voltage (Vt) values on an as needed basis. It is noted that if the memory cells utilized to characterize memory cell signal line propagation delay are established during manufacture utilizing specialized test modes of operation and/or test facilities and left in place for future use in updating memory cell signal line characterization, the memory device would not need to contain the facilities (e.g., slower clock functionality, reduced voltage ramp rate circuitry, etc.) to internally re-establish these test memory cells.

The slowing of the transition speed of the word line voltage signal in one or more embodiments of the present disclosure can be accomplished internally by the control logic of the memory device or, alternatively, by selection of an operational speed register setting to internally increase the transition times and/or slow the clocks driving these operations. In addition, the memory clocks of one or more embodiments of the present disclosure can also be slowed down through substitution with an externally supplied clock signal to stretch out the transition time of the word line voltage signal. For example, in the memory device embodiment of FIG. 7A, the clock driving the voltage ramp generator 728 can be divided down internally in one embodiment of the present disclosure under control of the control circuit 718. Alternatively, the voltage ramp generator 728 can be coupled to an externally provided alternative memory clock to slow down the generated word line voltage ramp. In addition, an analog voltage ramp generator, such as 728, can be utilized wherein the ramp rate can be controlled by a bias current and capacitance, for example. As the sense amplifiers 714 only cause the ADC converter 730 output to be captured in the data cache latches 716 when the coupled non-volatile memory cells of the selected row 724 are activated by the applied word line voltage ramp of the voltage ramp generator 728, they do not need to be separately clocked or slowed.

As noted above, in one or more embodiments of the present disclosure, characterization of the memory cell signal lines of a memory is accomplished during manufacture and stored in the initialization data of the memory. In one or more other embodiments of the present disclosure memory cell signal line propagation delay is characterized each time the memory is initialized (such as after power-up or a reset) or before initiating programming and/or sensing operations. It is also noted that in one or more other embodiments of the present disclosure, memory cell signal line propagation delay is characterized on a periodic basis or as needed. It is further noted that as memory cell signal lines can refer to access and/or data lines, both need not be characterized at the same time. For example, both access and data lines of a memory device might be characterized during the manufacturing process. However, only access lines might be characterized at a later time or on a periodic basis according to various embodiments of the present disclosure, for example.

Figure 9C:
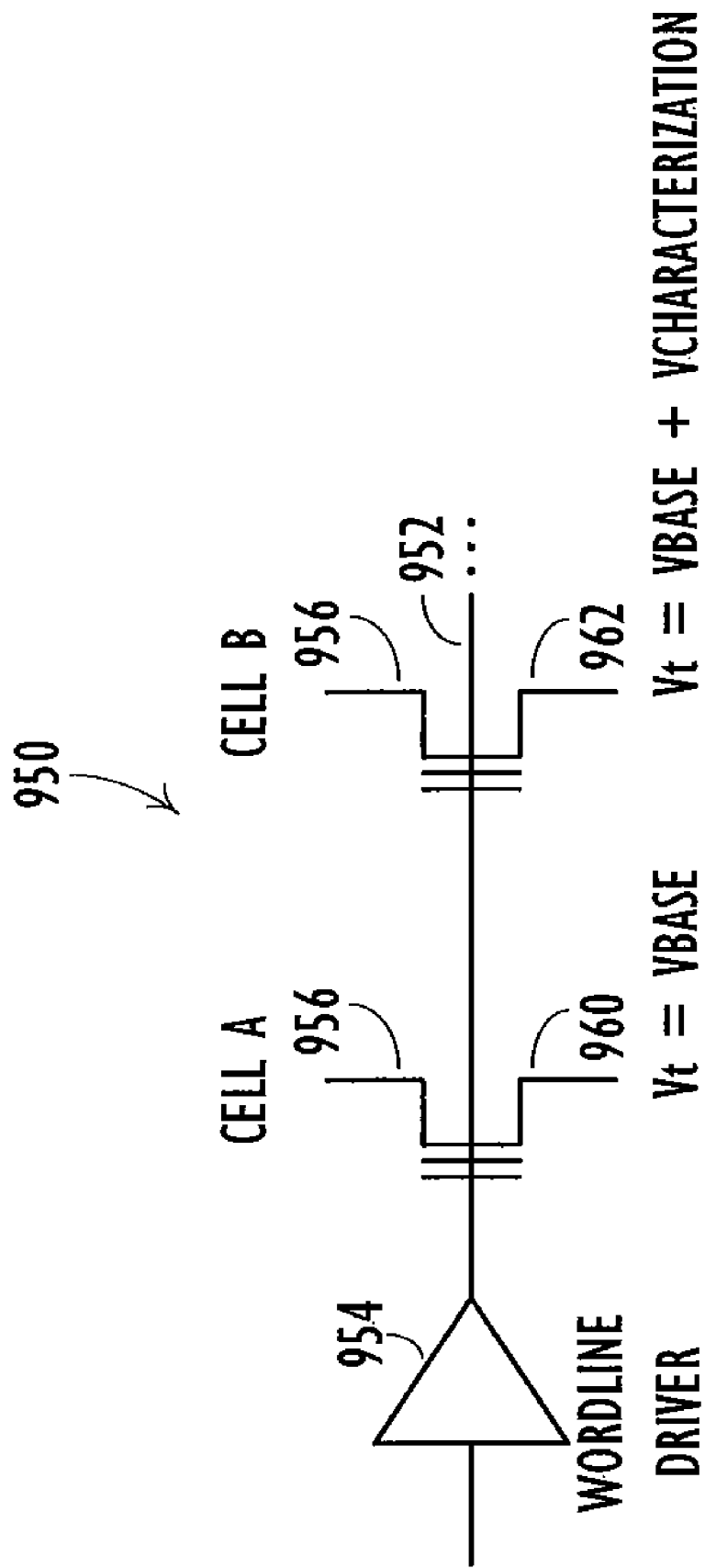

One or more embodiments of the present disclosure store the memory cell signal line propagation delay characterization in a digitized format in initialization data read by the memory device or its controller during memory initialization. In another embodiment of the present disclosure, the memory stores the memory cell signal line propagation delay characterization data as a voltage difference between the programmed threshold voltages of two non-volatile memory cells, as detailed in FIG. 9C. In FIG. 9C, a word line 952 is coupled to word line driver 954 and a plurality of non-volatile memory cells 956. A first memory cell (Cell A) 960 and a second memory cell (Cell B) 962 are coupled to the word line 952. Cell A 960 is programmed to a base threshold voltage level (Vt=Vbase), while Cell B 962 is programmed to threshold voltage that includes the base threshold voltage plus a voltage expressing the word line propagation delay characterization (Vt=Vbase+Vcharacterization), allowing the word line propagation delay characterization to be stored as the voltage difference between the threshold voltages of Cell A 960 and Cell B 962. It is noted that multiple memory cell signal line propagation delay characterizations (such as for word line and bit line along with differing sections of the memory) can be stored by adding additional second cells (Cell B) 962 to storing the additional memory cell signal line propagation delay characterizations as the voltage difference between the threshold voltages of Cell A 960 and each additional Cell B 962. It also is noted that one or more memory cell signal line propagation delay characterizations can also be stored as a voltage difference between a stable voltage reference source, such as a band gap voltage reference, and the programmed threshold voltages of one or more non-volatile memory cells. It is further noted that one or more embodiments of the present disclosure that store memory cell signal line propagation delay characterizations as memory cell threshold voltages and differences may be advantageously utilized with higher resolution programming and sensing (i.e., M+N state programming and M+L state sensing) to enable, for example, increased accuracy in sensing the stored threshold voltages. It is also noted that memory cell signal line propagation delay data can be stored for each word line, bit line, memory sector, memory section, array bank, or array, depending on the characterization needs of the memory and variability of the memory array.

Memory cell signal line propagation delay characterization data can also be established by word line, bit line, memory sector, memory section, array bank, or array, in embodiments of the present disclosure that establish memory cell signal line propagation delay characterization during the memory initialization process or before initiating programming operations. This again depends on the characterization needs of the memory and/or memory cell signal line variability of the memory array.

Once the memory cell signal line propagation delay is characterized the memory device or it's external controller can utilize the memory cell signal line propagation delay characterization with an algorithm to calculate an amount of threshold voltage (Vt) compensation required based on cell's physical location in the memory array, such as along a word line, for example. This compensation is utilized in one or more embodiments of the present disclosure to generate a pre-compensated target threshold voltage to be programmed into the selected memory cell, such that it senses as if programmed with the uncompensated target threshold voltage (Vt). In one or more alternative embodiments of the present disclosure, the compensation is utilized in a post-compensation operation after sensing to adjust the uncompensated threshold voltage sensed from the selected memory cell to that of a corrected voltage that is compensated for the memory cell signal line propagation delay. In one or more additional embodiments the compensation is utilized to fine adjust the sensed threshold voltages of one or more non-volatile memory cells that were programmed with pre-compensated target threshold voltages in a post-compensation operation to fine adjust the compensated threshold voltages to current memory cell signal line propagation delay characteristics, which can differ from the characterization utilized during the initial programming of the memory cells.

Figure 10A:
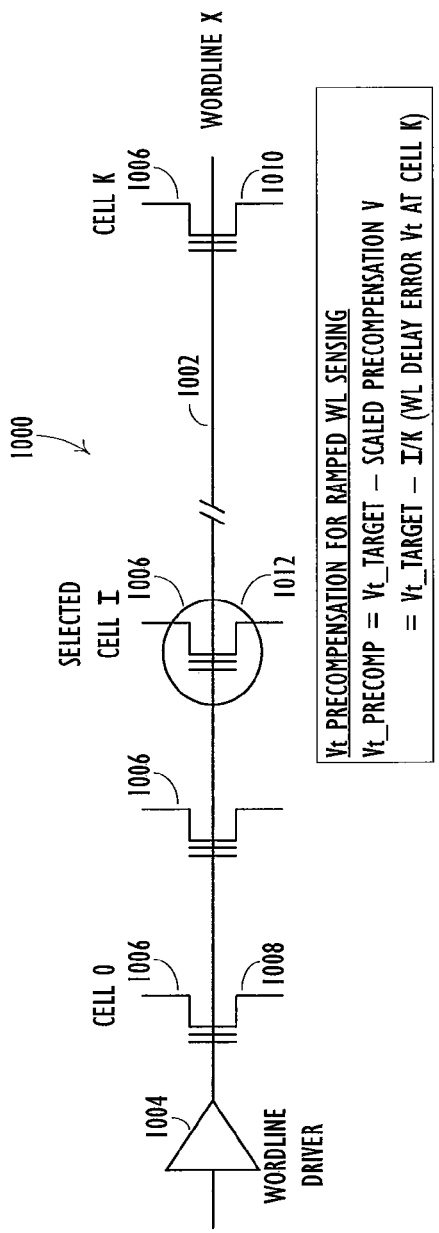
FIGS. 10A and 10B are schematics of word lines and delay compensation of a non-volatile memory array in accordance with embodiments of the present disclosure.

FIG. 10A details a simplified diagram of a row 1000 of a memory that utilizes pre-compensation of one or more embodiments of the present disclosure. In FIG. 10A, a row 1000 is detailed showing a word line 1002 coupled to word line driver 1004, the word line 1002 having a plurality of non-volatile memory cells 1006 coupled along its length. A first memory cell (Cell 0) 1008 is coupled to the word line 1002 in close proximity to the output of the word line driver 1004. A second memory cell (Cell K) 1010 is coupled to the end of the word line 1002 opposite the word line driver 1004. As stated above, due to the RC load of the word line 1002, any signal applied to the word line 1002 by the driver 1004 experiences delays as it propagates down the word line 1002. Thus, for example (as previously detailed in waveforms 770 and 772 of FIG. 7B), in one embodiment, a word line voltage ramp signal of a ramp sensing operation is delayed by 4 μS at Cell K 1010, and has only applied 1V to the control gate of Cell K 1010 at 14 μS, while Cell 0 1008 has 1.3V being applied at 14 μS. Thus, if both Cell 0 1008 and Cell K 1010 were programmed to Vt=1V, Cell 0 1008 would be sensed as having a Vt=1V while Cell K 1010 would be sensed as having a Vt=1.3V.

The memory of FIG. 10A, however, utilizes the word line delay characterization of the word line 1002 of the row 1000 with an algorithm to calculate amount of threshold voltage (Vt) compensation required based on a selected memory cell's (Cell I) 1012 physical location along word line 1002. The selected memory cell 1012 is then programmed with this pre-compensated threshold voltage (Vt_pre-comp) such that, when the selected memory cell 1012 is sensed, it senses as if programmed with the original target threshold voltage (Vt_target) that was to be programmed into the selected memory cell 1012. In one or more embodiments utilizing ramped word line sensing, which has an approximately linear word line signal propagation delay, this algorithm can be a simple scaling of the target threshold voltage, dependent on the position of the selected memory cell 1012 on the word line 1002. For example, Vt_precomp=Vt_target−scaled precompensation voltage=Vt_target−I/K (word line delay threshold voltage error at Cell K 1010). Thus, in the above example in one embodiment, where the word line propagation delay characterization is the word line delay threshold voltage error at Cell K 1010, or Vt_sensed−Vt_target=1.3V−1V=0.3V, the pre-compensation algorithm is Vt_precomp=Vt_target−I/K (0.3V). Thus to pre-compensate Cell K 1010, where the target threshold voltage is 1V, the compensated threshold voltage (Vt_precomp) that Cell K is to be programmed to is Vt_precomp=Vt_target−I/K (0.3V)=1.0V−K/K (0.3V) =0.7V, so that the final programmed, threshold voltage of Cell K will now be sensed as being 1.0V. As stated above, one or more embodiments of the present disclosure pre-compensate for word line propagation delay by pre-compensating the programmed threshold voltage of the memory cells utilizing higher M+N state per cell programming resolution based on the measured amount of error induced by the word line propagation delay and cell location on the selected word line. In one embodiment, the 0.3V pre-compensation adjustment of the 1.0V target threshold voltage (Vt_target) of above example is adjusted utilizing the N-states of "soft" program data, while the data state of the memory cell is selected by the M-states of "hard" program data being stored in the cell.

Figure 10B:
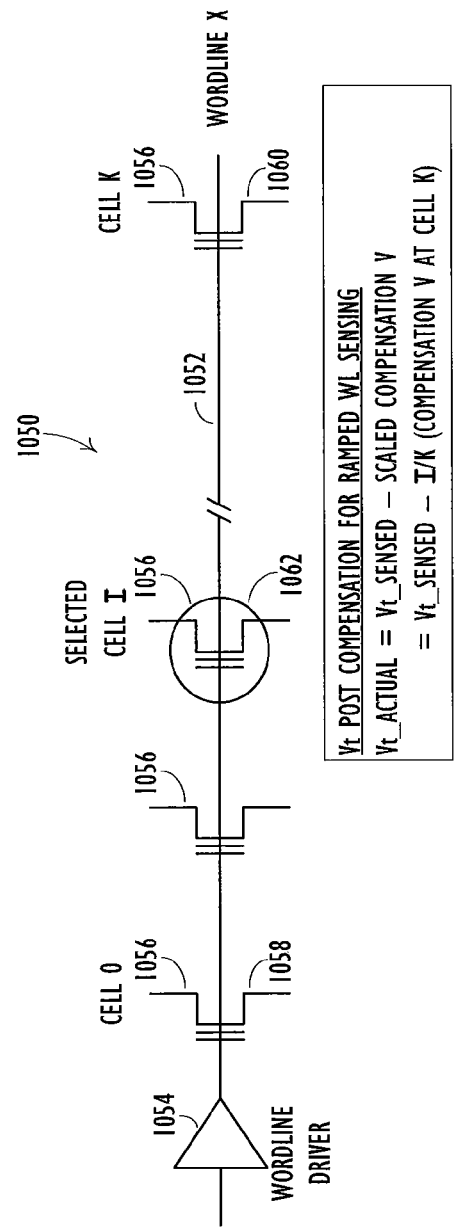

FIG. 10B details a simplified diagram of a row 1050 of a memory that utilizes post-compensation of one or more embodiments of the present disclosure. As with FIG. 10A, FIG. 10B details a row 1050 having a word line 1052 coupled to word line driver 1054, the word line 1052 containing a plurality of non-volatile memory cells 1056 coupled along its length. A first memory cell (Cell 0) 1058 is coupled to the word line 1052 in close proximity to the output of the word line driver 1054. A second memory cell (Cell K) 1060 is coupled to the end of the word line opposite the word line driver 1054. Due to the RC load of the word line 1052, any signal applied to the word line 1052 by the driver 1054 experiences delays as it propagates down the word line 1052. Thus, for example, as in FIG. 10A, in one embodiment, a word line voltage ramp signal of a ramp sensing operation is delayed by 4 µS at Cell K 1060, and has only applied 1V to the control gate of Cell K 1060 at 14 µS, while Cell 0 1058 has 1.3V being applied at 14 µS. Thus, if both Cell 0 1058 and Cell K 1060 were programmed to Vt=1V, Cell 0 1058 would be sensed as having a Vt=1V while Cell K 1060 would be sensed as having a Vt=1.3V.

However, the memory cells 1056 of the row 1050 of FIG. 10B are programmed with an un-compensated target threshold voltage (Vt_target) and a threshold voltage compensation based on the word line delay characterization of the word line 1052 that is applied to the sensed threshold voltage of a selected memory cell 1062 in a post-compensation operation to adjust the sensed threshold voltage (Vt_sensed) to the actual threshold voltage (Vt_actual) that was stored in the selected memory cell 1062. The memory of FIG. 10B utilizes the word line delay characterization of the word line 1052 of the row 1050 with an algorithm to calculate an amount of threshold voltage (Vt) compensation required based on a selected memory cell's (Cell I) 1062 physical location along word line 1052. In one or more embodiments utilizing ramped word line sensing, which has an approximately linear word line signal propagation delay, this algorithm can also be a scaling of the target threshold voltage, dependent on the position of the selected memory cell 1062 on the word line 1052. For example, Vt_actual=Vt_sensed−scaled compensation voltage=Vt_sensed−I/K (word line delay threshold voltage error at Cell K 1060). Thus, in the above example according to one or more embodiments, where the word line propagation delay characterization is the word line delay threshold voltage error at Cell K 1060, or Vt_sensed− Vt_actual=1.3V−1V=0.3V, the post-compensation algorithm is Vt_actual=Vt_sensed−I/K (0.3V). Thus to post-compensate the sensed threshold voltage (Vt_sensed) of Cell K 1060, where the sensed threshold voltage is 1.3V, the sensed threshold voltage (Vt_sensed) of Cell K 1060 is adjusted by subtracting the proportional amount of the word line delay threshold voltage error at Cell K 1060 (Vt_actual=Vt_sensed−I/K (0.3V)=1.3V−K/K (0.3V) =1.0V). As stated above, one or more embodiments of the present disclosure post-compensate for word line propagation delay by sensing the threshold voltage of the memory cells utilizing higher M+L states per cell sensing resolution. In one embodiment, the 1.3V sensed threshold voltage (Vt_sensed) of the above example is sensed utilizing M+L states of higher sensing resolution and adjusted with 0.3V of post-compensation adjustment utilizing the M+L states of higher sensing resolution before determining the M-states of "hard" data stored in the selected cell.

In one or more alternative embodiments of the present disclosure, post-compensation is utilized to fine tune pre-compensated memory cell threshold voltages to current memory cell signal line propagation delay characteristics. According to these one or more embodiments, the memory cell signal line propagation delay characterization that was utilized in pre-compensating the threshold voltages is stored in the memory, for example in the threshold voltage of a cell adjacent to the word line driver of a word line so as to experience as little word line propagation delay error as possible. The current word line propagation delay characterization is then detected and compared to the stored word line propagation delay characterization utilized in pre-compensating the programmed threshold voltages stored in the non-volatile memory cells being sensed. The sensed threshold voltages are then fine adjusted utilizing the word line propagation delay characterization difference and an algorithm to post-compensate (e.g., fine tune) the sensed threshold voltages. It is noted that the word line propagation delay characterizations utilized in pre-compensating the programmed threshold voltages can be stored for individual word lines, bit lines, erase blocks, memory sectors, memory sections, array banks and/ or whole memory arrays as needed for adjustment.

Figure 11:
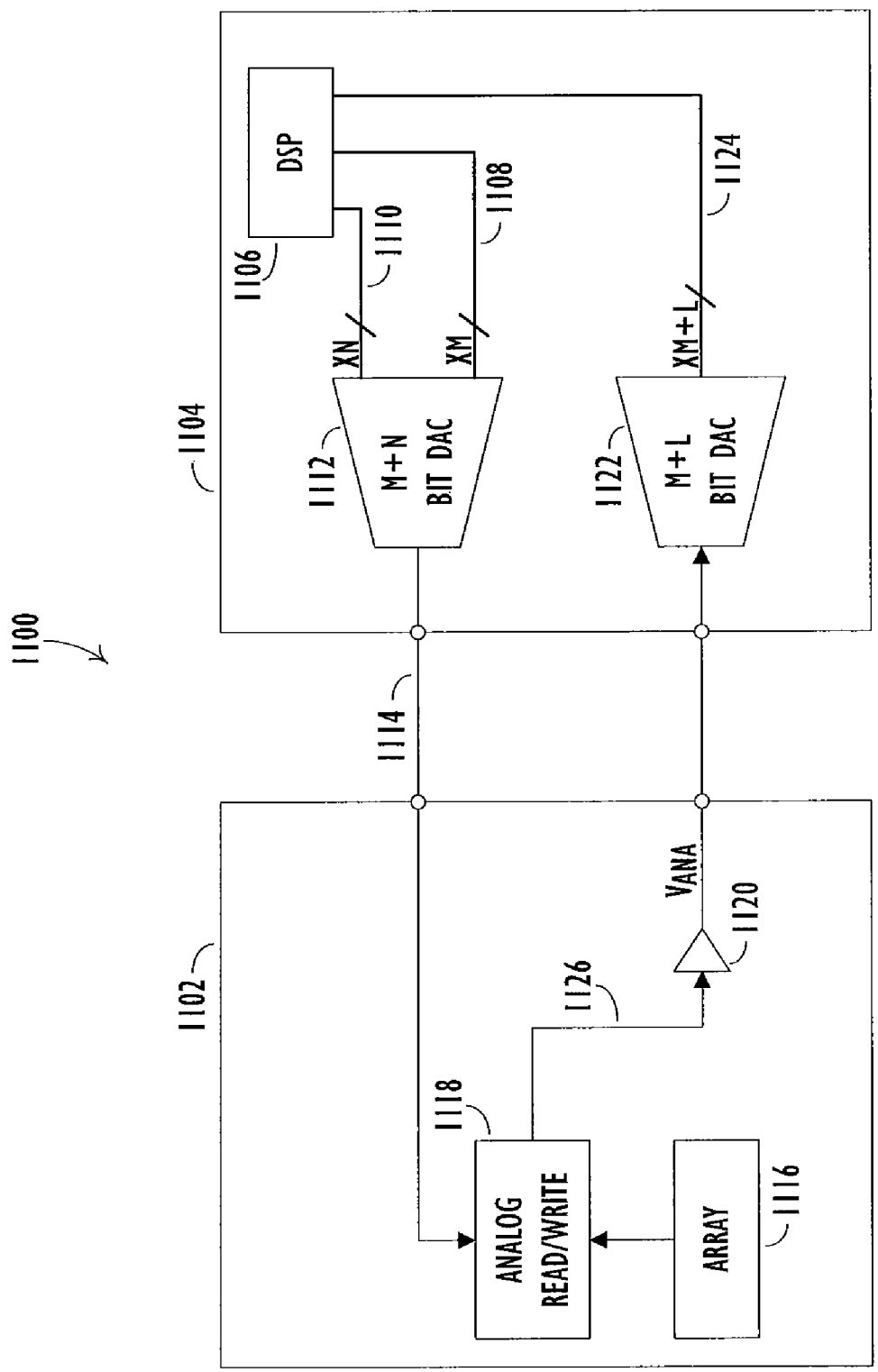
FIG. 11 is a block schematic of an electronic system in accordance with an embodiment of the present disclosure utilizing analog data communication.

FIG. 11 details a simplified diagram of system 1100 having an analog NAND architecture non-volatile memory device 1102 of an embodiment of the present disclosure coupled to a memory controller 1104. In FIG. 11, the data to be written to the non-volatile memory device 1102 is processed by an internal signal processor (e.g., Digital Signal Processor (DSP)) 1106 of the controller 1104, which outputs M bits of digital data (XM) 1108 in combination with the N bits (XN) 1110 of additional programming resolution for each selected memory cell to be written in the non-volatile memory device 1102. This M+N bits 1108, 1110 of program data for each selected memory cell is then converted by a M+N bit digital to analog converter (DAC) 1112 and output to the non-volatile memory device 1102 as an analog data signal 1114. Internal to the non-volatile memory device 1102, the M+N bit analog data signal 1114 is used to program a selected cell of the NAND architecture memory array 1116 by the read/write circuitry 1118 in a program operation.

Upon access one or more selected memory cells from the non-volatile memory device array 1116 are sensed by the read/write circuitry 1118. The sensed data 1126 is then buffered 1120 and transferred from the non-volatile memory device 1102 to the coupled memory controller 1104 as an analog signal. Within the memory controller 1104, the analog data value signal is converted from analog to digital values with an analog to digital converter 1122 and outputs at the higher M+L bits of read resolution 1124. This M+L bits of sensed threshold voltage read resolution for each cell is then coupled to the DSP 1106 for processing and retrieval of the stored M bits of data from each memory cell. It is noted that the analog signal bus 1114 transferring the analog data signal from the controller 1104 to the memory device 1102 can have multiple possible forms, including, but not limited to parallel signal buses, serial signal buses, bi-directional signal buses, and unidirectional transmit and receive signal buses.

As detailed above in FIG. 11, various embodiments of the present disclosure include memory devices adapted to process and generate analog data signals representative of data values of the M+N program states to store M bits of data in each cell. This is facilitated by storing data states as threshold voltage ranges on a non-volatile memory cell. Unlike the bit-by-bit programming operations of traditional multi-level cell technology, the various embodiments may program directly to a target threshold voltage for the desired data. Similarly, instead of reading individual bits, the various embodiments generate a data signal indicative of the threshold voltage of the target memory cell, and thus indicative of the M+L bits read from each cell, where M bits of data are stored in each cell.

It is noted that while various embodiments may receive and transmit the data signals as analog signals representative of bit patterns of two or more bits, they may also provide conversion internal to the memory device to an analog signal or selected threshold voltage range/state to permit receiving and transmitting digital signals representative of individual bits. It is also noted that in utilizing analog data signals, because a single analog data signal could represent two, four or more bits of information, data transfer rates may be increased along with memory density as each program or read operation is concurrently processing multiple bits per memory cell.

Figure 12:
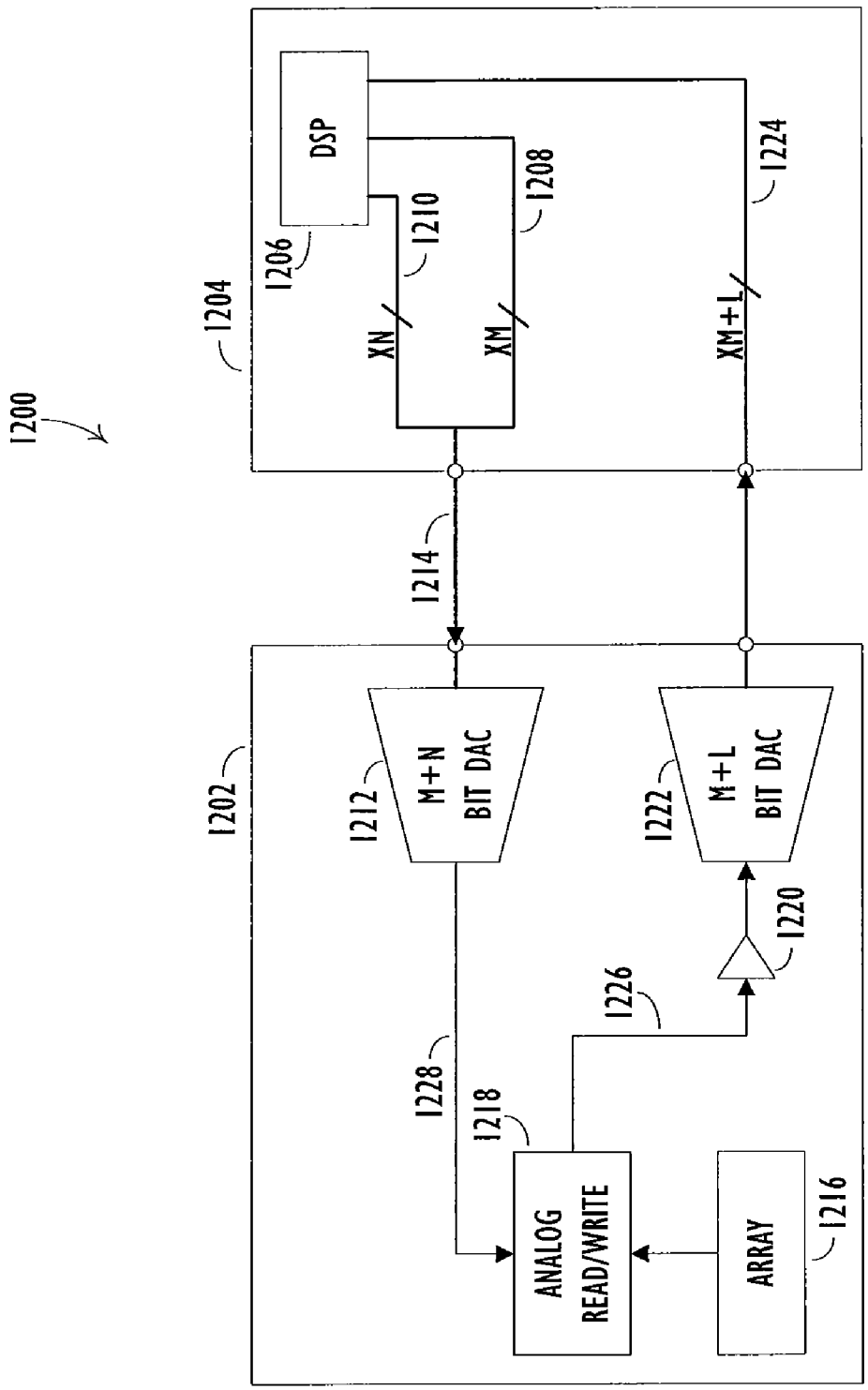
FIGS. 12 and 13 are block schematics of electronic systems in accordance with embodiments of the present disclosure utilizing digital data communication.
Figure 13:
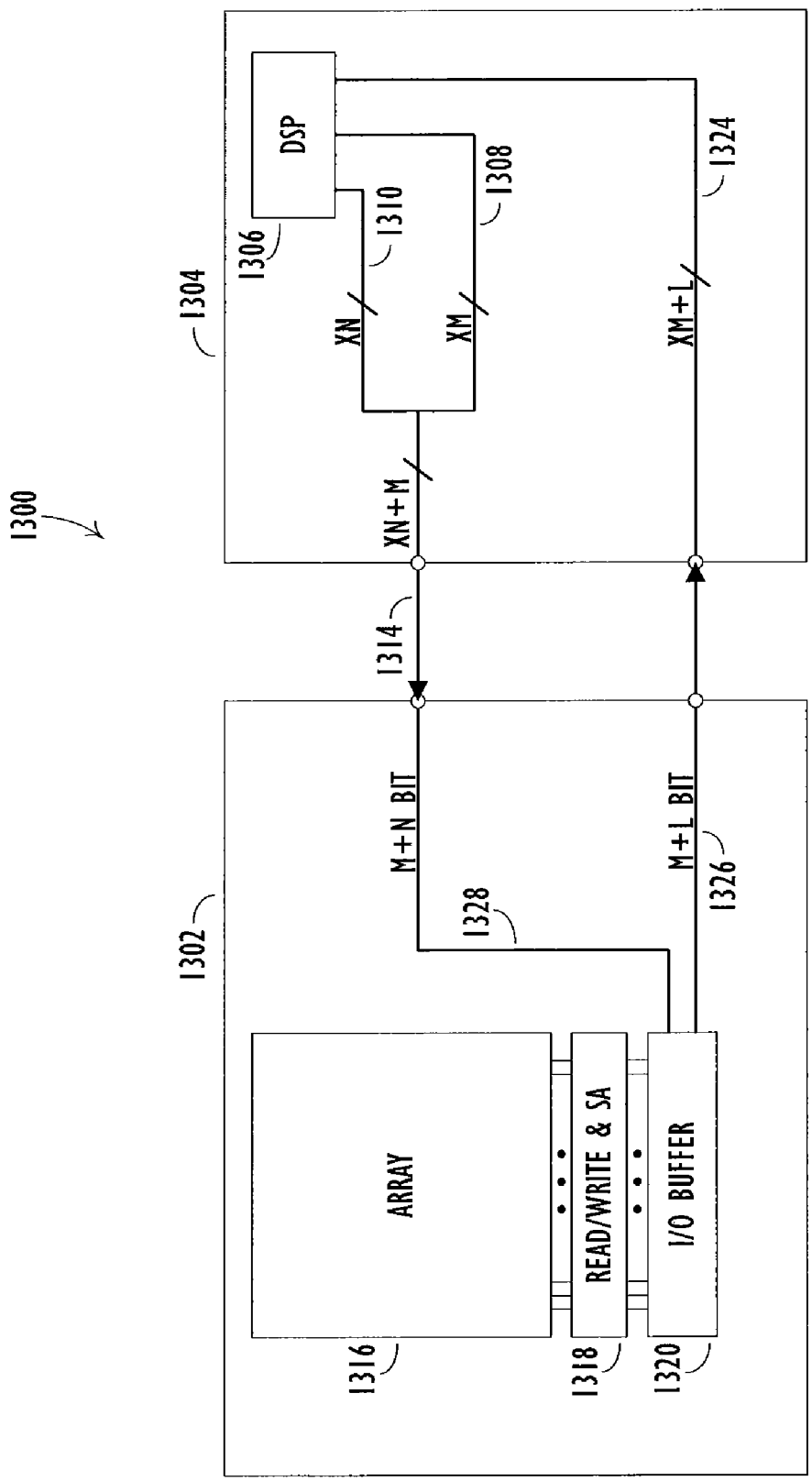

As detailed in FIGS. 12 and 13, additional embodiments of the present disclosure also include memory devices adapted to receive and process digital data signals representative of the M+N program states to store M bits of information in each cell. These digital data signals can then be utilized internal to the memory device to program threshold voltages in selected memory cells by either conversion to a threshold voltage representation or through direct selection of memory cell state defined by a threshold voltage range. In addition, in various embodiments of the present disclosure, the memory devices are adapted to generate and transmit digital data signals representative of the M+L bits read from each cell, where M bits of data are stored in each cell.

In FIG. 12, a simplified diagram is shown of a system 1200 having a NAND architecture non-volatile memory device 1202 of an embodiment of the present disclosure coupled to a memory controller 1204 utilizing digital communication and internal analog conversion of the digital data. The data to be written to the non-volatile memory device 1202 is processed by an internal digital signal processor (DSP) 1206 of the controller 1204, which outputs M bits of data 1208 in combination with the N bits 1210 of additional programming resolution for each selected memory cell to be written in the non-volatile memory device 1202. This M+N bits 1208, 1210 of program data for each memory cell selected to be programmed is then transferred 1214 as a digital representation to the memory device 1202 and converted by a M+N bit digital to analog converter (DAC) 1212 to an analog data signal 1228 internally to the non-volatile memory device 1202. The M+N bit analog data signal 1228 is used to program one or more selected cells of the memory array 1216 by the read/write circuitry 1218 in a program operation.

Upon access one or more selected memory cells of the non-volatile memory device array 1216 are sensed by the read/write circuitry 1218. The sensed threshold voltage(s) 1226 are then buffered 1220, if required, and converted from analog to digital signals with an analog to digital converter 1222 of the non-volatile memory device 1202 at the higher M+L bits of read resolution. This M+L bits 1224 of sensed threshold voltage read resolution for each cell is then transferred from the non-volatile memory device 1202 to the coupled memory controller 1204 and coupled to the DSP 1206 for processing and retrieval of the M bits of data stored in each memory cell.

In FIG. 13, a simplified diagram is shown of a system 1300 having a non-volatile memory device 1302 of an embodiment of the present disclosure coupled to a memory controller 1304 utilizing digital communication. The data to be written to the non-volatile memory device 1302 is processed by an internal digital signal processor (DSP) 1306 of the controller 1304, which outputs M bits of data 1308 in combination with the N bits 1310 of additional programming resolution for each selected memory cell to be written in the non-volatile memory device 1302. This M+N bits 1308, 1310 of program data for each memory cell selected to be programmed is then transferred across a bus 1314 as a digital representation to the memory device 1302. Internal to the memory device 1302 the M+N bits 132813 of program data is programmed by the sense amplifier and read/write circuitry 1318 in a program operation into the selected non-volatile memory cells of the memory array 1316 utilizing a state and programming threshold voltage level directly selected by the input M+N bit digital data.

Upon access one or more selected memory cells from the non-volatile memory device array 1316 are sensed by the read/write circuitry 1318 and the sensed threshold voltage matched to a digital representation of the elevated read resolution. This sensing and matching of the threshold voltage to a digital representation can be accomplished by one of any of the above detailed methods, including, but not limited to, traditional multi-pass reading, ramped word line voltage reading, or source-follower reading. This digital representation of the sensed threshold voltage is then buffered in the I/O Buffer 1320 and output 1326 at the higher M+L bits of read resolution from the non-volatile memory device 1302. After transfer from the non-volatile memory device 1302 to the coupled memory controller 1304, this M+L bits 1324 of sensed threshold voltage read resolution for each cell is coupled to the DSP 1306 for processing and retrieval of the M bits of data stored in each memory cell. It is noted that the digital bus 1214, 1314 transferring the digital data from the controller 1204, 1304 to the memory device 1202, 1302 of FIGS. 12 and 13 can have multiple possible forms, including, but not limited to parallel data buses, serial data buses, bi-directional data buses, and unidirectional data buses.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

CONCLUSION

A memory device and programming and/or reading process has been described that compensates for memory cell signal line propagation delays due to memory cell signal line propagation delays to compensate for sensing errors and to increase the overall threshold voltage range and non-volatile memory cell states available. Memory cell signal line propagation delay compensation is accomplished by characterizing the memory cell signal line propagation delay, such as measuring an amount of error due to the delay, and pre-compensating the programmed threshold voltage of the memory cells based on the measured amount of error induced by the memory cell signal line propagation delay and cell location in an array of memory cells. Alternatively, memory cell signal line propagation delay can be post-compensated for, or the pre-compensation fine tuned, in one or more embodiments of the present disclosure after sensing the threshold voltages of the selected memory cells based on the measured amount of error induced by the memory cell signal line propagation delay and cell location in the memory array. Memory cell signal line propagation delay compensation in one or more embodiments of the present disclosure is accomplished by pre-compensating the programmed threshold voltage of the memory cells utilizing increased M+N state per cell programming resolution based on the measured amount of error induced by the memory cell signal line propagation delay and cell location in the array of memory. Alternatively, memory cell signal line propagation delay in one or more embodiments of the present disclosure is post-compensated for or the pre-compensation fine tuned after sensing the threshold voltages of the selected memory cells with an increased resolution M+L state read, based on the measured amount of error induced by the memory cell signal line propagation delay and cell location in the array of memory. In this, M-bits of data represent M "hard" bits of data stored in the cell and the N-bits or L-bits represent the extra "soft" bits of additional programming or read resolution, respectively, to be utilized by the non-volatile memory, memory controller or system for cell Vt level programming or data interpretation and error correction of the sensed Vt level of each memory cell.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a memory, comprising:
   pre-compensating one or more threshold voltages to be programmed into one or more memory cells to compensate for memory cell signal line propagation delay of one or more memory cell signal lines coupled to the one or more memory cells; and
   programming the one or more pre-compensated threshold voltages into the one or more memory cells.

2. The method of claim 1, wherein programming the one or more pre-compensated threshold voltages into the one or more memory cells comprises,
   programming the one or more memory cells by programming each cell to one of M+N program states where M is a number of data states that can be stored in each memory cell and N is a number of additional programming resolution states.

3. The method of claim 2, wherein pre-compensating the one or more threshold voltages to be programmed into the one or more memory cells to compensate for memory cell signal line propagation delay of one or more memory cell signal lines coupled to the one or more memory cells, and programming the one or more memory cells by programming each cell of the one or more memory cells to one of M+N states, where M is a number of data states that can be stored in each memory cell and N is a number of additional programming resolution states comprises,
   pre-compensating the one or more threshold voltages to be programmed into the one or more memory cells to compensate for sensing error due to memory cell signal line propagation delay by adjusting which one of M+N program states to which the cell is to be programmed.

4. The method of claim 1, further comprising sensing one of M+L states from the one or more memory cells, where M is a number of data states that can be stored in each memory cell and L is a number of additional sense resolution states.

5. The method of claim 1, further comprising characterizing a memory cell signal line propagation delay of the one or more memory cell signal lines.

6. The method of claim 5, wherein characterizing the memory cell signal line propagation delay of the one or more memory cell signal lines comprises one of determining a threshold voltage sensing error due to the memory cell signal line propagation delay of each of the one or more memory cell signal lines, and determining an RC time constant of each of the one or more memory cell signal lines.

7. The method of claim 6, wherein characterizing the memory cell signal line propagation delay further comprises scaling the propagation delay of a particular memory cell signal line based on a particular location along the memory cell signal line.

8. A memory, comprising:
   a memory array;
   wherein the memory is adapted to pre-compensate a plurality of threshold voltages representing a plurality of states to compensate for memory cell signal line propagation delay before the plurality of threshold voltages are programmed into a plurality of selected memory cells.

9. The memory of claim 8, wherein the memory is adapted to program the plurality of memory cells by programming each cell of the plurality of memory cells to one of M+N program states, where M is a number of data states that can be stored in each memory cell and N is a number of additional programming resolution states.

10. The memory of claim 9, wherein the memory is adapted to pre-compensate the plurality of threshold voltages to be programmed into the plurality of memory cells to compensate for memory cell signal line propagation delay by adjusting which of the M+N program states each cell of the plurality of memory cells is to be programmed to.

11. The memory of claim 8, wherein the memory is further adapted to perform a read operation of the plurality of selected memory cells and to post-compensate the plurality of threshold voltages representing the plurality of states to compensate for memory cell signal line propagation delay following the read operation performed on the plurality of selected memory cells.

12. The memory of claim 11, wherein the memory is further adapted to perform a fine adjustment of the plurality of threshold voltages read from the plurality of selected memory cells wherein the fine adjustment is a function of the pre-compensation and the post-compensation performed on the plurality of threshold voltages.

13. A method of operating a memory, comprising:
   sensing one or more threshold voltages from one or more memory cells of the memory; and
   post-compensating the one or more threshold voltages sensed from the one or more memory cells to compensate for memory cell signal line propagation delays of one or more memory cell signal lines coupled to the one or more memory cells.

14. The method of claim 13, wherein sensing one or more threshold voltages from one or more memory cells of the memory comprises, sensing one of M+L sense states of one or more memory cells, where M is a number of data states that can be stored in each memory cell and L is a number of additional sense resolution states.

15. The method of claim 14, wherein sensing one of M+L sense states of the one or more memory cells, where M is a number of data states being stored in each memory cell and L is a number of additional sense resolution states, and post-compensating the one or more threshold voltages sensed from the one or more memory cells to compensate for sensing error due to memory cell signal line propagation delays of one or more memory cell signal lines coupled to the one or more memory cells comprises, post-compensating the one or more threshold voltages sensed from the one or more memory cells to compensate for sensing error due to memory cell signal line propagation delays of one or more memory cell signal lines coupled to the one or more memory cells by adjusting the L additional sense resolution states.

16. The method of claim 13, further comprising programming the one or more memory cells by programming M+N program states into the one or more memory cells, where M is a number of states that can be stored in each memory cell and N is a number of additional programming resolution data states.

17. The method of claim 13, wherein sensing one or more threshold voltages from one or more memory cells of the memory, and post-compensating the one or more threshold voltages sensed from the one or more memory cells to compensate for memory cell signal line propagation delays of one or more memory cell signal lines coupled to the one or more memory cells comprises, fine adjusting one or more pre-compensated threshold voltages sensed from one or more memory cells for current memory cell signal line delay characteristics, wherein the one or more pre-compensated threshold voltages are pre-compensated to adjust for memory cell signal line propagation delay of one or more memory cell signal lines coupled to the one or more memory cells.

18. A memory device, comprising:
a memory array having a plurality of memory cells; and
a control circuit;
wherein the memory device is adapted to sense a plurality of threshold voltages from the plurality of memory cells; and
wherein the memory device is further adapted to post-compensate the plurality of sensed threshold voltages to compensate for propagation delays of one or more memory cell signal lines coupled to the plurality of memory cells.

19. The memory device of claim 18, wherein the memory device is further adapted to sense M+L sense states from each memory cell of the plurality of memory cells, where M is a number of data states that can be stored in each memory cell and L is a number of additional sense resolution states, and where the memory is adapted to post-compensate the plurality of threshold voltages sensed from the plurality of memory cells to compensate for memory cell signal line propagation delays of one or more memory cell signal lines coupled to the plurality of memory cells by adjusting the L additional sense resolution states.

20. The memory device of claim 18, wherein the memory device is adapted to program each memory cell of the plurality of memory cells to one of M+N program states, where M is a number of data states that can be stored in each memory cell and N is a number of additional programming resolution states.

* * * * *